United States Patent
Lovett

(10) Patent No.: US 10,998,035 B1
(45) Date of Patent: May 4, 2021

(54) POWER-EFFICIENT GENERATION OF VOLTAGE

(71) Applicant: Micron Technology, Inc., Boise, ID (US)

(72) Inventor: Simon J. Lovett, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/656,433

(22) Filed: Oct. 17, 2019

(51) Int. Cl.
  *G11C 11/4074* (2006.01)
  *G11C 11/22* (2006.01)

(52) U.S. Cl.
  CPC ........ *G11C 11/4074* (2013.01); *G11C 11/221* (2013.01); *G11C 11/2297* (2013.01)

(58) Field of Classification Search
  CPC .............. G11C 11/4074; G11C 11/221; G11C 11/2297
  USPC .................................................... 327/108–112
  See application file for complete search history.

(56) References Cited

U.S. PATENT DOCUMENTS

| | | | |
|---|---|---|---|
| 2010/0283439 A1* | 11/2010 | Singh | H02M 1/088 323/282 |
| 2013/0343096 A1* | 12/2013 | Stuler | H02M 1/32 363/21.02 |
| 2016/0006434 A1* | 1/2016 | Wright | H03K 19/0016 327/110 |

* cited by examiner

*Primary Examiner* — John W Poos
(74) *Attorney, Agent, or Firm* — Holland & Hart LLP

(57) ABSTRACT

Methods, systems, and devices for power-efficient generation of voltage are described. A driver circuit in a memory device may produce a voltage on an output node for other components in the memory device to use. To produce the voltage, the driver circuit may use a first voltage supply to charge the output node to a first threshold voltage level. The driver may then use a second voltage source to charge the output node to a second threshold voltage level that is different than (e.g., higher than) the first threshold voltage level.

22 Claims, 9 Drawing Sheets

US 10,998,035 B1

POWER-EFFICIENT GENERATION OF VOLTAGE

BACKGROUND

The following relates generally to a system that includes at least one memory device and more specifically to power-efficient generation of voltage.

Memory devices are widely used to store information in various electronic devices such as computers, wireless communication devices, cameras, digital displays, and the like. Information is stored by programming different states of a memory device. For example, binary devices most often store one of two states, often denoted by a logic 1 or a logic 0. In other devices, more than two states may be stored. To access the stored information, a component of the device may read, or sense, at least one stored state in the memory device. To store information, a component of the device may write, or program, the state in the memory device.

Various types of memory devices exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source. FeRAM may be able to achieve densities similar to volatile memory but may have non-volatile properties due to the use of a ferroelectric capacitor as a storage device.

A memory device may include one or more driver circuits that provide voltage for operating the memory device. But driver circuits may be inefficient, resulting in wasted power. Thus, techniques for efficiently generating voltages for use by a memory device may be desired.

DETAILED DESCRIPTION

A memory device may include various voltage supplies that provide voltage at various levels for use in operating the memory device. The memory device may also include one or more components that facilitate operation of the memory device. In some examples, a component may include an internal voltage supply that is generated using voltage supplies that are external to the component (but internal to the memory device). For example, the component may use one or more low voltage supplies that are external to the component to generate an internal voltage supply that has a relatively high voltage. The component may use this internal voltage supply to generate an output voltage for use by other components of the memory device. For example, a driver circuit within the component may use the internal voltage supply to charge an output node of the driver circuit to a desired voltage level. But exclusively using the internal voltage supply to generate the desired voltage may be inefficient (e.g., due to losses associated with the process of generating the internal voltage supply from the external voltage supplies), resulting in wasted power, among other disadvantages.

According to the techniques described herein, a driver circuit within a component of a memory device may efficiently generate an output voltage (e.g., a relatively high output voltage) by using multiple voltage supplies (e.g., that are internal and external to the component). For example, the driver circuit may first charge its output node to an intermediate level using an external voltage supply. Because the external voltage supply has not been generated using a lossy process, the charging may be highly efficient. Next, the driver circuit may finish charging its output node to a desired voltage level using the internal voltage supply. Because the internal voltage supply is now used only to charge a fraction of the lode capacitance, the charging process may be more efficient compared to a process that exclusively uses the internal voltage supply to charge the output node.

Features of the disclosure are initially described in the context of a memory system and memory die as described with reference to FIGS. 1 and 2. Features of the disclosure are described in the context a driver circuit and its operation as described with reference to FIGS. 3A-5. These and other features of the disclosure are further illustrated by and described with reference to flowcharts that relate to power-efficient generation of voltage as described with references to FIGS. 6-9.

Figure 1:
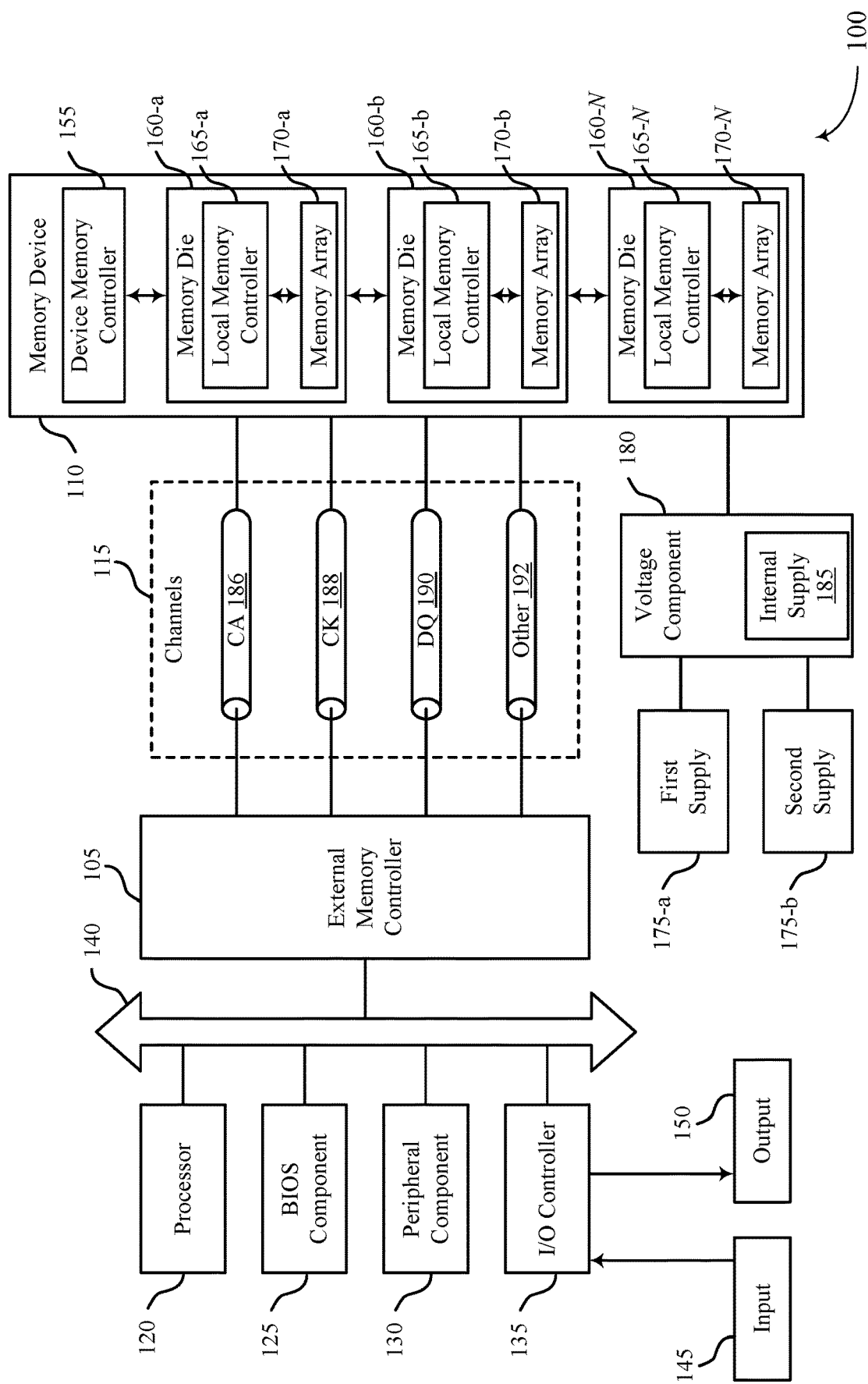
FIG. 1 illustrates an example of a system that supports power-efficient generation of voltage in accordance with examples as disclosed herein.

FIG. 1 illustrates an example of a system 100 that utilizes one or more memory devices in accordance with examples as disclosed herein. The system 100 may include an external memory controller 105, a memory device 110, and a plurality of channels 115 coupling the external memory controller 105 with the memory device 110. The system 100 may include one or more memory devices, but for ease of description the one or more memory devices may be described as a single memory device 110.

The system 100 may include portions of an electronic device, such as a computing device, a mobile computing device, a wireless device, or a graphics processing device. The system 100 may be an example of a portable electronic device. The system 100 may be an example of a computer, a laptop computer, a tablet computer, a smartphone, a cellular phone, a wearable device, an internet-connected device, or the like. The memory device 110 may be component of the system configured to store data for one or more other components of the system 100. In some examples, the system 100 is capable of machine-type communication (MTC), machine-to-machine (M2M) communication, or device-to-device (D2D) communication.

At least portions of the system 100 may be examples of a host device. Such a host device may be an example of a device that uses memory to execute processes such as a computing device, a mobile computing device, a wireless device, a graphics processing device, a computer, a laptop computer, a tablet computer, a smartphone, a cellular phone, a wearable device, an internet-connected device, some other stationary or portable electronic device, a vehicle, a vehicle controller, or the like. In some cases, the host device may refer to the hardware, firmware, software, or a combination thereof that implements the functions of the external memory controller 105. In some cases, the external memory controller 105 may be referred to as a host or host device. In some examples, system 100 is a graphics card.

In some cases, a memory device 110 may be an independent device or component that is configured to be in communication with other components of the system 100 and provide physical memory addresses/space to potentially be used or referenced by the system 100. In some examples, a memory device 110 may be configurable to work with at least one or a plurality of different types of systems 100. Signaling between the components of the system 100 and the memory device 110 may be operable to support modulation schemes to modulate the signals, different pin designs for communicating the signals, distinct packaging of the system 100 and the memory device 110, clock signaling and synchronization between the system 100 and the memory device 110, timing conventions, and/or other factors.

The memory device 110 may be configured to store data for the components of the system 100. In some cases, the memory device 110 may act as a slave-type device to the system 100 (e.g., responding to and executing commands provided by the system 100 through the external memory controller 105). Such commands may include an access command for an access operation, such as a write command for a write operation, a read command for a read operation, a refresh command for a refresh operation, or other commands. The memory device 110 may include two or more memory dice 160 (e.g., memory chips) to support a desired or specified capacity for data storage. The memory device 110 including two or more memory dice may be referred to as a multi-die memory or package (also referred to as multi-chip memory or package).

The system 100 may further include a processor 120, a basic input/output system (BIOS) component 125, one or more peripheral components 130, and an input/output (I/O) controller 135. The components of system 100 may be in electronic communication with one another using a bus 140.

The processor 120 may be configured to control at least portions of the system 100. The processor 120 may be a general-purpose processor, a digital signal processor (DSP), an application-specific integrated circuit (ASIC), a field-programmable gate array (FPGA) or other programmable logic device, discrete gate or transistor logic, discrete hardware components, or it may be a combination of these types of components. In such cases, the processor 120 may be an example of a central processing unit (CPU), a graphics processing unit (GPU), a general purpose graphic processing unit (GPGPU), or a system on a chip (SoC), among other examples.

The BIOS component 125 may be a software component that includes a BIOS operated as firmware, which may initialize and run various hardware components of the system 100. The BIOS component 125 may also manage data flow between the processor 120 and the various components of the system 100, e.g., the peripheral components 130, the I/O controller 135, etc. The BIOS component 125 may include a program or software stored in read-only memory (ROM), flash memory, or any other non-volatile memory.

The peripheral component(s) 130 may be any input device or output device, or an interface for such devices, that may be integrated into or with the system 100. Examples may include disk controllers, sound controller, graphics controller, Ethernet controller, modem, universal serial bus (USB) controller, a serial or parallel port, or peripheral card slots, such as peripheral component interconnect (PCI) or specialized graphics ports. The peripheral component(s) 130 may be other components understood by those skilled in the art as peripherals.

The I/O controller 135 may manage data communication between the processor 120 and the peripheral component(s) 130, input devices 145, or output devices 150. The I/O controller 135 may manage peripherals that are not integrated into or with the system 100. In some cases, the I/O controller 135 may represent a physical connection or port to external peripheral components.

The input 145 may represent a device or signal external to the system 100 that provides information, signals, or data to the system 100 or its components. This may include a user interface or interface with or between other devices. In some cases, the input 145 may be a peripheral that interfaces with system 100 via one or more peripheral components 130 or may be managed by the I/O controller 135.

The output 150 may represent a device or signal external to the system 100 configured to receive an output from the system 100 or any of its components. Examples of the output 150 may include a display, audio speakers, a printing device, or another processor on printed circuit board, and so forth. In some cases, the output 150 may be a peripheral that interfaces with the system 100 via one or more peripheral components 130 or may be managed by the I/O controller 135.

The components of system 100 may be made up of general-purpose or special purpose circuitry designed to carry out their functions. This may include various circuit elements, for example, conductive lines, transistors, capacitors, inductors, resistors, amplifiers, or other active or passive elements, configured to carry out the functions described herein.

The memory device 110 may include a device memory controller 155 and one or more memory dice 160. Each memory die 160 may include a local memory controller 165 (e.g., local memory controller 165-a, local memory controller 165-b, and/or local memory controller 165-N) and a memory array 170 (e.g., memory array 170-a, memory array 170-b, and/or memory array 170-N). A memory array 170 may be a collection (e.g., a grid) of memory cells, with each memory cell being configured to store at least one bit of digital data. Features of memory arrays 170 and/or memory cells are described in more detail with reference to FIG. 2.

The memory device 110 may be an example of a two-dimensional (2D) array of memory cells or may be an example of a three-dimensional (3D) array of memory cells. For example, a 2D memory device may include a single memory die 160. A 3D memory device may include two or more memory dice 160 (e.g., memory die 160-a, memory die 160-b, and/or any quantity of memory dice 160-N). In a 3D memory device, a plurality of memory dice 160-N may be stacked on top of one another or next to one another. In some cases, memory dice 160-N in a 3D memory device may be referred to as decks, levels, layers, or dies. A 3D memory device may include any quantity of stacked memory dice 160-N (e.g., two high, three high, four high, five high, six high, seven high, eight high). This may increase the quantity of memory cells that may be positioned on a substrate as compared with a single 2D memory device, which in turn may reduce production costs or increase the performance of the memory array, or both. In some 3D memory device, different decks may share at least one common access line such that some decks may share at least one of a word line, a digit line, and/or a plate line.

The device memory controller 155 may include circuits or components configured to control operation of the memory device 110. As such, the device memory controller 155 may include the hardware, firmware, and software that enables the memory device 110 to perform commands and may be configured to receive, transmit, or execute commands, data, or control information related to the memory device 110. The device memory controller 155 may be configured to communicate with the external memory controller 105, the one or more memory dice 160, or the processor 120. In some cases, the memory device 110 may receive data and/or commands from the external memory controller 105. For example, the memory device 110 may receive a write command indicating that the memory device 110 is to store certain data on behalf of a component of the system 100 (e.g., the processor 120) or a read command indicating that the memory device 110 is to provide certain data stored in a memory die 160 to a component of the system 100 (e.g., the processor 120). In some cases, the device memory controller 155 may control operation of the memory device 110 described herein in conjunction with the local memory controller 165 of the memory die 160. Examples of the components included in the device memory controller 155 and/or the local memory controllers 165 may include receivers for demodulating signals received from the external memory controller 105, decoders for modulating and transmitting signals to the external memory controller 105, logic, decoders, amplifiers, filters, or the like.

The local memory controller 165 (e.g., local to a memory die 160) may be configured to control operations of the memory die 160. Also, the local memory controller 165 may be configured to communicate (e.g., receive and transmit data and/or commands) with the device memory controller 155. The local memory controller 165 may support the device memory controller 155 to control operation of the memory device 110 as described herein. In some cases, the memory device 110 does not include the device memory controller 155, and the local memory controller 165 or the external memory controller 105 may perform the various functions described herein. As such, the local memory controller 165 may be configured to communicate with the device memory controller 155, with other local memory controllers 165, or directly with the external memory controller 105 or the processor 120.

The external memory controller 105 may be configured to enable communication of information, data, and/or commands between components of the system 100 (e.g., the processor 120) and the memory device 110. The external memory controller 105 may act as a liaison between the components of the system 100 and the memory device 110 so that the components of the system 100 may not need to know the details of the memory device's operation. The components of the system 100 may present requests to the external memory controller 105 (e.g., read commands or write commands) that the external memory controller 105 satisfies. The external memory controller 105 may convert or translate communications exchanged between the components of the system 100 and the memory device 110. In some cases, the external memory controller 105 may include a system clock that generates a common (source) system clock signal. In some cases, the external memory controller 105 may include a common data clock that generates a common (source) data clock signal.

In some cases, the external memory controller 105 or other component of the system 100, or its functions described herein, may be implemented by the processor 120. For example, the external memory controller 105 may be hardware, firmware, or software, or some combination thereof implemented by the processor 120 or other component of the system 100. While the external memory controller 105 is depicted as being external to the memory device 110, in some cases, the external memory controller 105, or its functions described herein, may be implemented by a memory device 110. For example, the external memory controller 105 may be hardware, firmware, or software, or some combination thereof implemented by the device memory controller 155 or one or more local memory controllers 165. In some cases, the external memory controller 105 may be distributed across the processor 120 and the memory device 110 such that portions of the external memory controller 105 are implemented by the processor 120 and other portions are implemented by a device memory controller 155 or a local memory controller 165. Likewise, in some cases, one or more functions ascribed herein to the device memory controller 155 or local memory controller 165 may in some cases be performed by the external memory controller 105 (either separate from or as included in the processor 120).

The components of the system 100 may exchange information with the memory device 110 using a plurality of channels 115. In some examples, the channels 115 may enable communications between the external memory controller 105 and the memory device 110. Each channel 115 may include one or more signal paths or transmission mediums (e.g., conductors) between terminals associated with the components of system 100. For example, a channel 115 may include a first terminal including one or more pins or pads at external memory controller 105 and one or more pins or pads at the memory device 110. A pin may be an example of a conductive input or output point of a device of the system 100, and a pin may be configured to act as part of a channel. In some cases, a pin or pad of a terminal may be part of to a signal path of the channel 115. Additional signal paths may be coupled with a terminal of a channel for routing signals within a component of the system 100. For example, the memory device 110 may include signal paths (e.g., signal paths internal to the memory device 110 or its components, such as internal to a memory die 160) that route a signal from a terminal of a channel 115 to the various components of the memory device 110 (e.g., a device memory controller 155, memory dice 160, local memory controllers 165, memory arrays 170).

Channels 115 (and associated signal paths and terminals) may be dedicated to communicating specific types of information. In some cases, a channel 115 may be an aggregated channel and thus may include multiple individual channels. For example, a data channel 190 may be ×4 (e.g., including four signal paths), ×8 (e.g., including eight signal paths), ×16 (e.g., including sixteen signal paths), and so forth. Signals communicated over the channels may use a double data rate (DDR) timing scheme. For example, some symbols of a signal may be registered on a rising edge of a clock signal and other symbols of the signal may be registered on a falling edge of the clock signal. Signals communicated over channels may use single data rate (SDR) signaling. For example, one symbol of the signal may be registered for each clock cycle.

In some cases, the channels 115 may include one or more command and address (CA) channels 186. The CA channels 186 may be configured to communicate commands between the external memory controller 105 and the memory device 110 including control information associated with the commands (e.g., address information). For example, the CA channel 186 may include a read command with an address of the desired data. In some cases, the CA channels 186 may be registered on a rising clock signal edge and/or a falling clock signal edge. In some cases, a CA channel 186 may include any quantity of signal paths to decode address and command data (e.g., eight or nine signal paths).

In some cases, the channels 115 may include one or more clock signal (CK) channels 188. The CK channels 188 may be configured to communicate one or more common clock signals between the external memory controller 105 and the memory device 110. Each clock signal may be configured to oscillate between a high state and a low state and coordinate the actions of the external memory controller 105 and the memory device 110. In some cases, the clock signal may be a differential output (e.g., a CK_t signal and a CK_c signal) and the signal paths of the CK channels 188 may be configured accordingly. In some cases, the clock signal may be single ended. A CK channel 188 may include any quantity of signal paths. In some cases, the clock signal CK (e.g., a CK_t signal and a CK_c signal) may provide a timing reference for command and addressing operations for the memory device 110, or other system-wide operations for the memory device 110. The clock signal CK may therefore be variously referred to as a control clock signal CK, a command clock signal CK, or a system clock signal CK. The system clock signal CK may be generated by a system clock, which may include one or more hardware components (e.g., oscillators, crystals, logic gates, transistors, or the like).

In some cases, the channels 115 may include one or more data (DQ) channels 190. The data channels 190 may be configured to communicate data and/or control information between the external memory controller 105 and the memory device 110. For example, the data channels 190 may communicate information (e.g., bi-directional) to be written to the memory device 110 or information read from the memory device 110.

In some cases, the channels 115 may include one or more other channels 192 that may be dedicated to other purposes. These other channels 192 may include any quantity of signal paths.

In some cases, the other channels 192 may include one or more write clock signal (WCK) channels. While the 'W' in WCK may nominally stand for "write," a write clock signal WCK (e.g., a WCK_t signal and a WCK_c signal) may provide a timing reference for access operations generally for the memory device 110 (e.g., a timing reference for both read and write operations). Accordingly, the write clock signal WCK may also be referred to as a data clock signal WCK. The WCK channels may be configured to communicate a common data clock signal between the external memory controller 105 and the memory device 110. The data clock signal may be configured to coordinate an access operation (e.g., a write operation or read operation) of the external memory controller 105 and the memory device 110. In some cases, the write clock signal may be a differential output (e.g., a WCK_t signal and a WCK_c signal) and the signal paths of the WCK channels may be configured accordingly. A WCK channel may include any quantity of signal paths. The data clock signal WCK may be generated by a data clock, which may include one or more hardware components (e.g., oscillators, crystals, logic gates, transistors, or the like).

In some cases, the other channels 192 may include one or more error detection code (EDC) channels. The EDC channels may be configured to communicate error detection signals, such as checksums, to improve system reliability. An EDC channel may include any quantity of signal paths.

The channels 115 may couple the external memory controller 105 with the memory device 110 using a variety of different architectures. Examples of the various architectures may include a bus, a point-to-point connection, a crossbar, a high-density interposer such as a silicon interposer, or channels formed in an organic substrate or some combination thereof. For example, in some cases, the signal paths may at least partially include a high-density interposer, such as a silicon interposer or a glass interposer.

Signals communicated over the channels 115 may be modulated using a variety of different modulation schemes. In some cases, a binary-symbol (or binary-level) modulation scheme may be used to modulate signals communicated between the external memory controller 105 and the memory device 110. A binary-symbol modulation scheme may be an example of a M-ary modulation scheme where M is equal to two. Each symbol of a binary-symbol modulation scheme may be configured to represent one bit of digital data (e.g., a symbol may represent a logic 1 or a logic 0). Examples of binary-symbol modulation schemes include, but are not limited to, non-return-to-zero (NRZ), unipolar encoding, bipolar encoding, Manchester encoding, pulse amplitude modulation (PAM) having two symbols (e.g., PAM2), and/or others.

In some cases, a multi-symbol (or multi-level) modulation scheme may be used to modulate signals communicated between the external memory controller 105 and the memory device 110. A multi-symbol modulation scheme may be an example of a M-ary modulation scheme where M is greater than or equal to three. Each symbol of a multi-symbol modulation scheme may be configured to represent more than one bit of digital data (e.g., a symbol may represent a logic 00, a logic 01, a logic 10, or a logic 11). Examples of multi-symbol modulation schemes include, but are not limited to, PAM3, PAM4, PAM8, etc., quadrature amplitude modulation (QAM), quadrature phase shift keying (QPSK), and/or others. A multi-symbol signal (e.g., PAM3 signal or PAM4 signal) may be a signal that is modulated using a modulation scheme that includes at least three levels to encode more than one bit of information per symbol. Multi-symbol modulation schemes and symbols may alternatively be referred to as non-binary, multi-bit, or higher-order modulation schemes and symbols.

System 100 may include various voltage supplies that are configured to provide voltages at various levels for operating system 100. For example, system 100 may include a first voltage supply 175-a (e.g., VDD1) configured to provide voltage at a first level (e.g., 1.8 V) and a second voltage supply 175-b (e.g., VDD2) configured to provide voltage at a second level (e.g., 1.05 V). But some parts of system 100 (e.g., access lines, sense components) may require voltages higher than those provided by the first and second voltage supplies 175. So, system 100 may include a voltage component 180 that generates a higher voltage from the first and second voltage supplies 175. For example, the voltage component 180 may use the first and second power supplies 175 and a capacitive pump to generate a voltage supply (e.g., VCCP) that has a higher voltage (e.g., 3.2 V) than either of the first and second voltage supplies 175. Because the higher voltage supply is generated at the voltage component 180, the higher voltage supply 185 may be referred to as an internal voltage supply 185 (where the term "internal" is with respect to the component). Conversely, the first and second voltage supplies 175 may be referred to as external voltage supplies (where the term "external" is with respect to the component) because they are generated outside of the voltage component 180.

Once generated, the internal voltage supply 185 may be used by the voltage component 180 and/or provided to other components in system 100. For example, the voltage component may 180 use the internal voltage supply 185 to charge an output node to the higher voltage level. But exclusively using the internal voltage supply 185 to charge the output node may be inefficient due to losses associated with the generation of the internal voltage supply 185. For example, the charge pumping process implemented by the component to generate the internal voltage supply 185 may be inefficient, meaning that the process may consume more current (e.g., 60% more current) than it provides. So, charging the output node using only the internal voltage supply 185 may result in an inefficient use of power.

According to the techniques described herein, the voltage component 180 may increase power efficiency by using both internal and external voltage supplies to charge the output node. For example, the component may include a driver circuit that uses an external voltage supply (e.g., external voltage supply 175-a, which may be VDD1) to charge the output node to an intermediate voltage level (e.g., 1.8 V). Because the external voltage supply is free of losses associated with a capacitive pump, the charging may be highly efficient. Next, the driver circuit may use an internal voltage (e.g., internal voltage supply 185) supply to finish charging the output node to the higher voltage level (e.g., 3.2 V). Thus, a relatively high voltage may be generated in a power-efficient manner.

Figure 2:
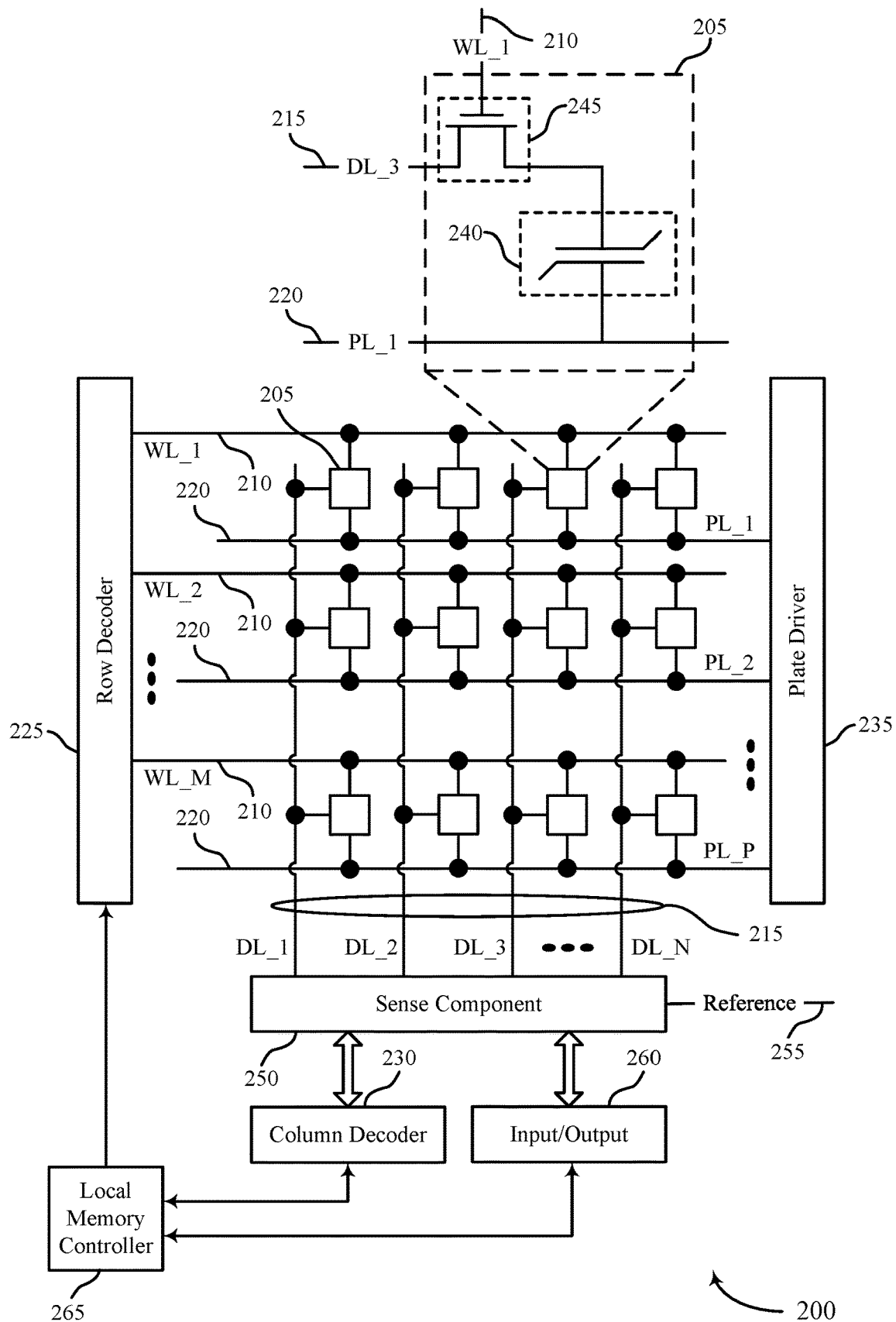
FIG. 2 illustrates an example of a memory die that supports power-efficient generation of voltage in accordance with examples as disclosed herein.

FIG. 2 illustrates an example of a memory die 200 in accordance with examples as disclosed herein. The memory die 200 may be an example of the memory dice 160 described with reference to FIG. 1. In some cases, the memory die 200 may be referred to as a memory chip, a memory device, or an electronic memory apparatus. The memory die 200 may include one or more memory cells 205 that are programmable to store different logic states. Each memory cell 205 may be programmable to store two or more states. For example, the memory cell 205 may be configured to store one bit of information at a time (e.g., a logic 0 or a logic 1). In some cases, a single memory cell 205 (e.g., a multi-level memory cell) may be configured to store more than one bit of information at a time (e.g., a logic 00, logic 01, logic 10, or a logic 11).

A memory cell 205 may store a state (e.g., polarization state or dielectric charge) that represents digital data. In FeRAM architectures, the memory cell 205 may include a capacitor that includes a ferroelectric material to store a charge and/or a polarization representative of the programmable state. In DRAM architectures, the memory cell 205 may include a capacitor that includes a dielectric material to store a charge representative of the programmable state.

Operations such as reading and writing may be performed on memory cells 205 by activating or selecting access lines such as a word line 210, a digit line 215, and/or a plate line 220. In some cases, digit lines 215 may also be referred to as bit lines. References to access lines, word lines, digit lines, plate lines or their analogues, are interchangeable without loss of understanding or operation. Activating or selecting a word line 210, a digit line 215, or a plate line 220 may include applying a voltage to the respective line. In some cases, the voltage applied to an access line may be a higher voltage than that supplied by the voltage supplies of the memory device that includes the memory die 200. So, the memory device may include a component that generates the higher voltage from the available voltage supplies.

The memory die 200 may include the access lines (e.g., the word lines 210, the digit lines 215, and the plate lines 220) arranged in a grid-like pattern. Memory cells 205 may be positioned at intersections of the word lines 210, the digit lines 215, and/or the plate lines 220. By biasing a word line 210, a digit line 215, and a plate line 220 (e.g., applying a voltage to the word line 210, digit line 215, or plate line 220), a single memory cell 205 may be accessed at their intersection.

Accessing the memory cells 205 may be controlled through a row decoder 225, a column decoder 230, and a plate driver 235. For example, a row decoder 225 may receive a row address from the local memory controller 265 and activate a word line 210 based on the received row address. A column decoder 230 receives a column address from the local memory controller 265 and activates a digit line 215 based on the received column address. A plate driver 235 may receive a plate address from the local memory controller 265 and activates a plate line 220 based on the received plate address. For example, the memory die 200 may include multiple word lines 210, labeled WL_1 through WL_M, multiple digit lines 215, labeled DL_1 through DL_N, and multiple plate lines, labeled PL_1 through PL_P, where M, N, and P depend on the size of the memory array. Thus, by activating a word line 210, a digit line 215, and a plate line 220, e.g., WL_1, DL_3, and PL_1, the memory cell 205 at their intersection may be accessed. The intersection of a word line 210 and a digit line 215, in either a two-dimensional or three-dimensional configuration, may be referred to as an address of a memory cell 205. In some cases, the intersection of a word line 210, a digit line 215, and a plate line 220 may be referred to as an address of the memory cell 205.

The memory cell 205 may include a logic storage component, such as capacitor 240, and a switching component 245. The capacitor 240 may be an example of a ferroelectric capacitor. A first node of the capacitor 240 may be coupled with the switching component 245 and a second node of the capacitor 240 may be coupled with a plate line 220. The switching component 245 may be an example of a transistor or any other type of switch device that selectively establishes or de-establishes electronic communication between two components.

Selecting or deselecting the memory cell 205 may be accomplished by activating or deactivating the switching component 245. The capacitor 240 may be in electronic communication with the digit line 215 using the switching component 245. For example, the capacitor 240 may be isolated from digit line 215 when the switching component 245 is deactivated, and the capacitor 240 may be coupled with digit line 215 when the switching component 245 is activated. In some cases, the switching component 245 is a transistor and its operation is controlled by applying a voltage to a transistor gate, where the voltage differential between the transistor gate and transistor source is greater or less than a threshold voltage of the transistor. In some cases, the switching component 245 may be a p-type transistor or an n-type transistor. The word line 210 may be in electronic communication with the gate of the switching component 245 and may activate/deactivate the switching component 245 based on a voltage being applied to word line 210.

A word line 210 may be a conductive line in electronic communication with a memory cell 205 that is used to perform access operations on the memory cell 205. In some architectures, the word line 210 may be in electronic communication with a gate of a switching component 245 of a memory cell 205 and may be configured to control the switching component 245 of the memory cell. In some architectures, the word line 210 may be in electronic communication with a node of the capacitor of the memory cell 205 and the memory cell 205 may not include a switching component.

A digit line 215 may be a conductive line that connects the memory cell 205 with a sense component 250. In some architectures, the memory cell 205 may be selectively coupled with the digit line 215 during portions of an access operation. For example, the word line 210 and the switching component 245 of the memory cell 205 may be configured to selected couple and/or isolate the capacitor 240 of the memory cell 205 and the digit line 215. In some architectures, the memory cell 205 may be in electronic communication (e.g., constant) with the digit line 215.

A plate line 220 may be a conductive line in electronic communication with a memory cell 205 that is used to perform access operations on the memory cell 205. The plate line 220 may be in electronic communication with a node (e.g., the cell bottom) of the capacitor 240. The plate line 220 may be configured to cooperate with the digit line 215 to bias the capacitor 240 during access operation of the memory cell 205.

The sense component 250 may be configured to determine a state (e.g., a polarization state or a charge) stored on the capacitor 240 of the memory cell 205 and determine a logic state of the memory cell 205 based on the detected state. The charge stored by a memory cell 205 may be extremely small, in some cases. As such, the sense component 250 may include one or more sense amplifiers to amplify the signal output of the memory cell 205. The sense amplifiers may detect minute changes in the charge of a digit line 215 during a read operation and may produce signals corresponding to either a logic 0 or a logic 1 based on the detected charge. During a read operation, the capacitor 240 of memory cell 205 may output a signal (e.g., discharge a charge) to its corresponding digit line 215. The signal may cause a voltage of the digit line 215 to change.

The sense component 250 may be configured to compare the signal received from the memory cell 205 across the digit line 215 to a reference signal 255 (e.g., a reference voltage). The sense component 250 may determine the stored state of the memory cell 205 based on the comparison. For example, in binary-signaling, if digit line 215 has a higher voltage than the reference signal 255, the sense component 250 may determine that the stored state of memory cell 205 is a logic 1, and, if the digit line 215 has a lower voltage than the reference signal 255, the sense component 250 may determine that the stored state of the memory cell 205 is a logic 0.

The sense component 250 may include various transistors or amplifiers to detect and amplify a difference in the signals. The detected logic state of the memory cell 205 may be provided as an output of the sense component 250 (e.g., to an input/output 260), and may indicate the detected logic state to another component of a memory device 110 that includes the memory die 200, such as a device memory controller 155 (e.g., directly or using the local memory controller 265). In some cases, the sense component 250 may be in electronic communication with the row decoder 225, the column decoder 230, and/or the plate driver 235. In some cases, the sense component 250 may be configured to operate using a higher voltage than that produced by the voltage supplies of the memory device. Accordingly, the memory device may include a component that uses the available voltage supplies to generate a voltage supply that can provide the higher voltage used by the sense component 250.

The local memory controller 265 may control the operation of memory cells 205 through the various components (e.g., row decoder 225, column decoder 230, plate driver 235, and sense component 250). The local memory controller 265 may be an example of the local memory controller 165 described with reference to FIG. 1. In some cases, one or more of the row decoder 225, column decoder 230, and plate driver 235, and sense component 250 may be co-located with the local memory controller 265. The local memory controller 265 may be configured to receive one or more commands and/or data from an external memory controller 105 (or a device memory controller 155 described with reference to FIG. 1), translate the commands and/or data into information that can be used by the memory die 200, perform one or more operations on the memory die 200, and communicate data from the memory die 200 to the external memory controller 105 (or the device memory controller 155) in response to performing the one or more operations. The local memory controller 265 may generate row, column, and/or plate line address signals to activate the target word line 210, the target digit line 215, and the target plate line 220. The local memory controller 265 may also generate and control various voltages or currents used during the operation of the memory die 200. In general, the amplitude, shape, or duration of an applied voltage or current discussed herein may be adjusted or varied and may be different for the various operations discussed in operating the memory die 200.

In some cases, the local memory controller 265 may be configured to perform a precharge operation on the memory die 200. A precharge operation may comprise precharging one or more components and/or access lines of the memory die 200 to one or more predetermined voltage levels. In some instances, the memory cell 205 and/or portions of the memory die 200 may be precharged between different access operations. In some instances, the digit line 215 and/or other components may be precharged before a read operation.

In some cases, the local memory controller 265 may be configured to perform a write operation (e.g., a programming operation) on one or more memory cells 205 of the memory die 200. During a write operation, a memory cell 205 of the memory die 200 may be programmed to store a desired logic state. In some cases, a plurality of memory cells 205 may be programmed during a single write operation. The local memory controller 265 may identify a target memory cell 205 on which to perform the write operation. The local memory controller 265 may identify a target word line 210, a target digit line 215, and/or a target plate line 220 in electronic communication with the target memory cell 205 (e.g., the address of the target memory cell 205). The local memory controller 265 may activate the target word line 210, the target digit line 215, and/or the target plate line 220 (e.g., applying a voltage to the word line 210, digit line 215, or the plate line 220), to access the target memory cell 205. The local memory controller 265 may apply a specific signal (e.g., voltage) to the digit line 215 and a specific signal (e.g., voltage) to the plate line 220 during the write operation to store a specific state in the capacitor 240 of the memory cell 205, the specific state being indicative of a desired logic state.

In some cases, the local memory controller 265 may be configured to perform a read operation (e.g., a sense operation) on one or more memory cells 205 of the memory die 200. During a read operation, the logic state stored in a memory cell 205 of the memory die 200 may be determined. In some cases, a plurality of memory cells 205 may be sensed during a single read operation. The local memory controller 265 may identify a target memory cell 205 on which to perform the read operation. The local memory controller 265 may identify a target word line 210, a target digit line 215, and/or a target plate line 220 in electronic communication with the target memory cell 205 (e.g., the address of the target memory cell 205). The local memory controller 265 may activate the target word line 210, the target digit line 215, and/or a target plate line 220 (e.g., applying a voltage to the word line 210, the digit line 215, or the plate line 220), to access the target memory cell 205. The target memory cell 205 may transfer a signal to the sense component 250 in response to biasing the access lines. The sense component 250 may amplify the signal. The local memory controller 265 may fire the sense component 250 (e.g., latch the sense component) and thereby compare the signal received from the memory cell 205 to the reference signal 255. Based on that comparison, the sense component 250 may determine a logic state that is stored on the memory cell 205. The local memory controller 265 may communicate the logic state stored on the memory cell 205 to the external memory controller 105 (or the device memory controller) as part of the read operation.

In some memory architectures, accessing the memory cell 205 may degrade or destroy the logic state stored in a memory cell 205. For example, a read operation performed on a ferroelectric memory cell may destroy the logic state stored in the ferroelectric capacitor. In another example, a read operation performed in DRAM architectures may partially or completely discharge the capacitor of the target memory cell. The local memory controller 265 may perform a re-write operation or a refresh operation to return the memory cell to its original logic state. The local memory controller 265 may re-write the logic state to the target memory cell after a read operation. In some cases, the re-write operation may be considered part of the read operation. Additionally, activating a single access line, such as a word line 210, may disturb the state stored in some memory cells in electronic communication with that access line. Thus, a re-write operation or refresh operation may be performed on one or more memory cells that may not have been accessed.

As noted, a memory device that includes memory die 200 may also include voltage supplies that are configured to provide voltages at different levels for use in operating memory die 200 and other components of the memory device. But some parts of a memory device may use or require a higher voltage than that provided by the voltage supplies. For example, an access line or sense component 250 may be activated by the higher voltage. So, the memory device may include a voltage component that generates a higher voltage supply using the available voltage supplies. The generated voltage supply may be internal to the voltage component whereas the available voltage supplies may be external to the voltage component.

In some cases, the voltage component may use its internal voltage supply to charge the output node of the voltage component so that the higher voltage is available for use by other components (e.g., so that the higher voltage can be used to activate one or more access lines, sense components, etc.). But exclusively using the internal voltage supply to charge the output node may be an inefficient use of power, because generation of the internal voltage supply may consume more current than it provides.

According to the techniques described herein, a driver circuit of the voltage component may use an external voltage supply in tandem with the internal voltage supply to efficiently produce a high (or "relatively high") voltage (e.g., a voltage that is higher than the voltages supplied by the external voltage supplies). For example, the driver circuit may use an external voltage supply to charge the output node to an intermediate voltage level. This charging process may be power-efficient because unlike the internal voltage supply, the external voltage supply is not generated via a lossy charge-pumping process. Next, the driver circuit may finish charging the output node to the high voltage using the internal voltage supply. Because the inefficient internal voltage supply is only used to provide a portion of the charge on the output node, the charging process may consume less power than other processes that use the internal voltage supply to provide the full charge on the output node.

Figure 3A:
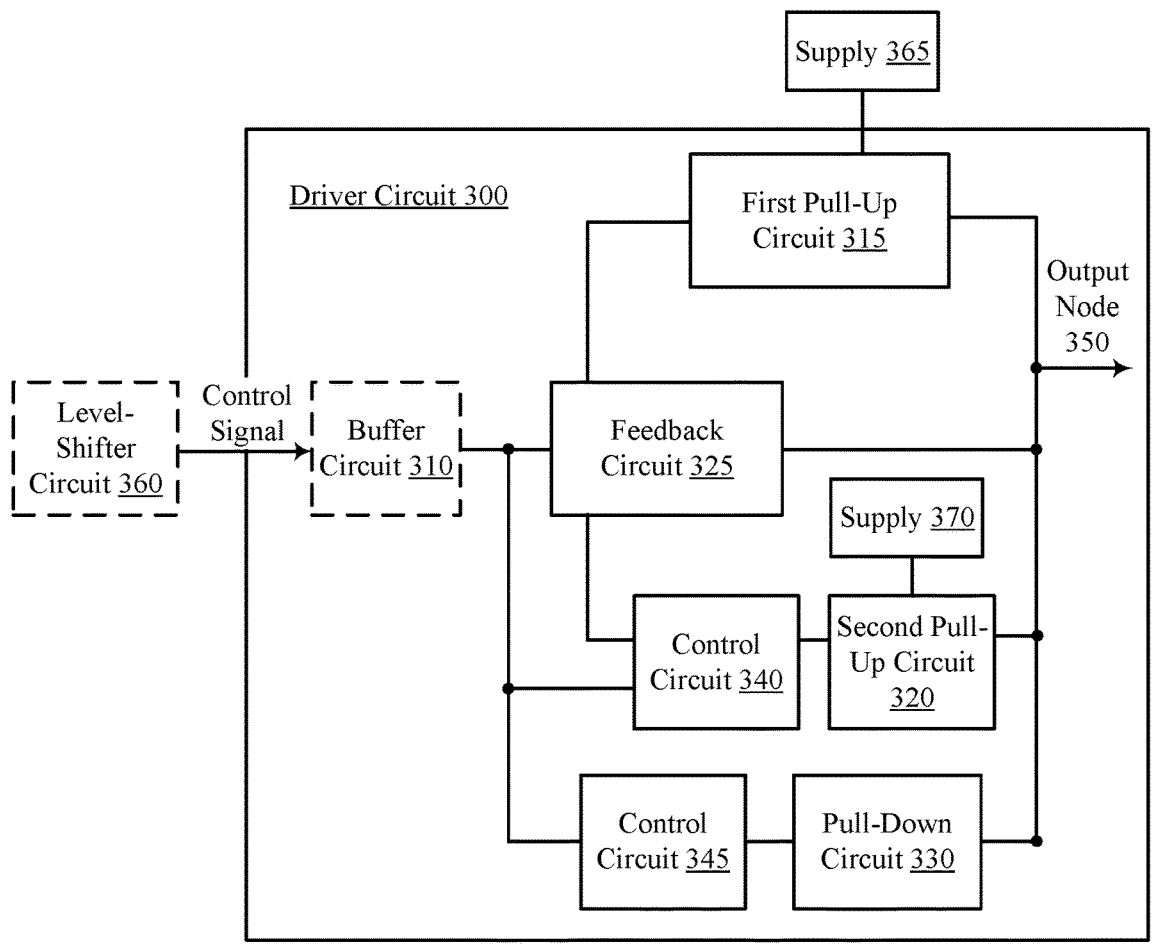
FIGS. 3A-3C illustrate an example of a driver circuit that supports power-efficient generation of voltage in accordance with examples as disclosed herein.
Figure 3B:
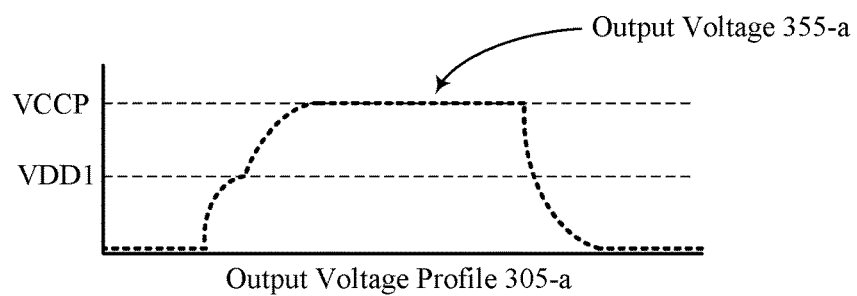
Figure 3C:
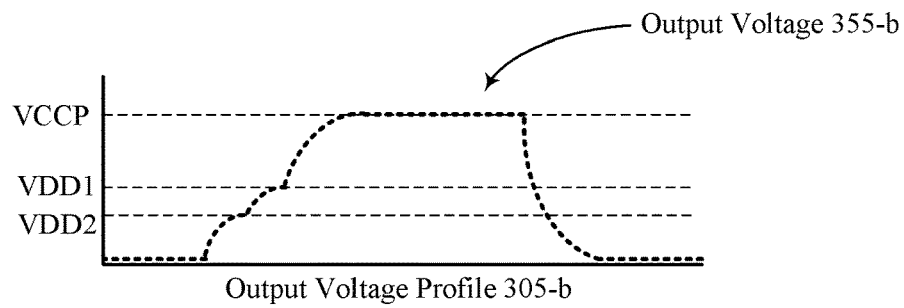

FIGS. 3A-3C illustrate an example of a driver circuit 300 and two output voltage profiles 305 in accordance with examples as disclosed herein. Driver circuit 300 may be operated to produce an output voltage that is used to activate other components, or conductive lines (e.g., access lines such as word lines, plate lines, and digit lines), or both. Driver circuit 300 may conserve power by using a first voltage supply, such as an external voltage supply (e.g., voltage supply 365) to partially charge its output node 350 to a first threshold level (e.g., VDD1), and then using a second voltage supply, such as an internal voltage supply (e.g., voltage supply 370) to finish charging the output node 350 to a second threshold level (VCCP). Thus, driver circuit 300 may be operated to produce an output voltage 355-a as shown in output voltage profile 305-a. In some examples, because charging using an external voltage supply may be more efficient than charging using internal voltage supply, driver circuit 300 may consume less power than other driver circuits that solely use internal voltage sources for charging.

In some cases, additional circuitry or components may be added to driver circuit 300 so that driver circuit 300 can be operated to produce an output voltage 355-b as shown in output profile 355-b. For example, a first external voltage supply may be used to charge the output node 350 to a first threshold level (e.g., VDD2), a second external voltage supply may be used to charge the output node 350 to a second threshold level (e.g., VDD1), and an internal voltage supply may be used to charge the output node 350 to a third threshold level (e.g., VDD2).

Driver circuit 300 may include a buffer circuit 310, a first pull-up circuit 315, a second pull-up circuit 320, a feedback circuit 325, and a pull-down circuit 330. The second pull-up circuit 320 may be coupled with a control circuit 340 and the pull-down circuit 330 may be coupled associated with a control circuit 345. Driver circuit 300 may also include, or be coupled with, a level-shifter circuit 360. The operations of driver circuit 300 may be controlled by a control signal that is received by the driver circuit 300. The control signal may be generated and transmitted by component (e.g., a memory controller) external to the driver circuit 300. In some cases, the level of the control signal may be shifted (e.g., by the level-shifter circuit 360) before it is received at driver circuit 300.

In some examples, the control signal may be passed through buffer circuit 310 so that application of the control signal to other components of driver circuit 300 is properly timed. For example, the buffer circuit 310 may be operable to delay the control signal by inverting the control signal one or more times before transferring it to feedback circuit 325, control circuit 340, and control circuit 345.

The first pull-up circuit 315 may be operable to charge output node 350 to a first threshold level (e.g., around VDD1). For example, first pull-up circuit 315 may couple the output node 350 with a first voltage supply (e.g., external voltage supply 365, which may be configured to provide a voltage of VDD1). The second pull-up circuit 320 may be operable to charge output node 350 from the first threshold level to a second threshold level (e.g., around VCCP) that is higher than the first threshold level. For example, the second pull-up circuit 320 may be operable to couple the output node 350 to a second voltage supply (e.g., internal voltage supply 370, which may be configured to provide a voltage of VCCP) after the first pull-up circuit has charged the output node to the first threshold level. Due to inefficiencies associated with the generation of the second power supply, this dual-supply charging process may be more power efficient compared to a single-supply charging process that exclusively uses the second voltage supply.

Feedback circuit 325 may be coupled with the first pull-up circuit 315, control circuit 340, and output node 350. Feedback circuit 325 may be operable to activate and deactivate the first pull-up circuit 315 based on a control signal and the voltage of output node 350. For example, feedback circuit 325 may activate the first pull-up circuit 315 when triggered to do so (e.g., by the control signal) and feedback circuit 325 may deactivate the first pull-up circuit when the voltage of output node 350 reaches the first threshold level (e.g., around VDD1). Feedback circuit 325 may also trigger control circuit 340 to activate the second pull-up circuit 320 (e.g., after first pull-up circuit has been deactivated) so that the output node 350 can charge to the second threshold level. The second pull-up circuit 320 may remain activated until the control signal triggers the feedback circuit 325 to deactivate the second pull-up circuit 320. In some examples, the control signal may also trigger control circuit 345 to activate pull-down circuit 330, which may be operable to reduce the voltage on output node 350. For example, pull-down circuit 330 may be operable to couple the output node 350 to a ground reference so that the driver circuit 300 stops outputting voltage (and consuming power).

Figure 4:
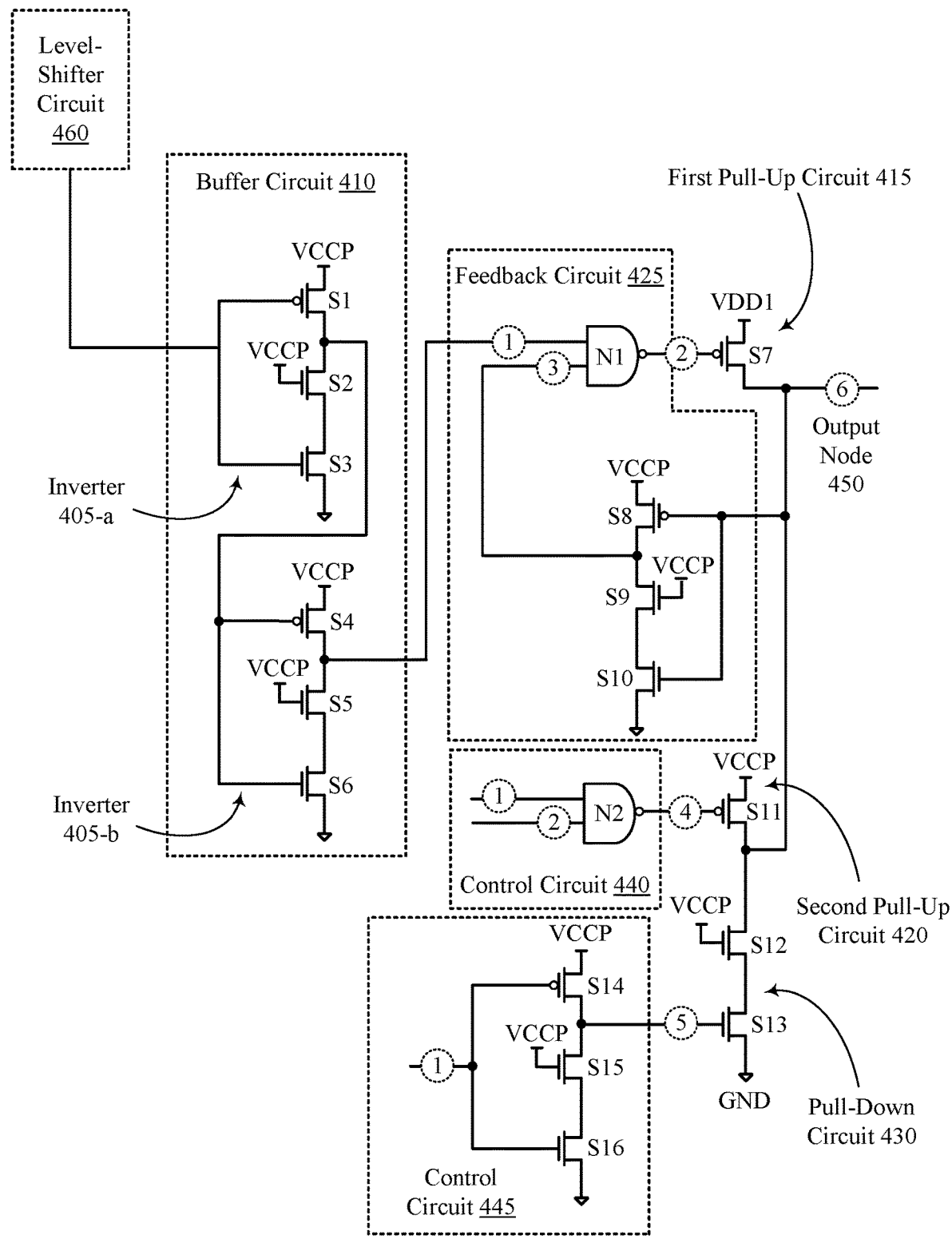
FIG. 4 illustrates an example of a driver circuit that supports power-efficient generation of voltage in accordance with examples as disclosed herein.

FIG. 4 illustrates an example of a driver circuit 400 that supports power-efficient generation of voltage in accordance with examples as disclosed herein. Driver circuit 400 may include buffer circuit 410, first pull-up circuit 415, second pull-up circuit 420, feedback circuit 425, and pull-down circuit 430, which may be examples of the corresponding circuits described with reference to FIGS. 3A-3C. Driver circuit 400 may also include control circuit 440, control circuit 445, and level-shifter circuit 460. Driver circuit 400 may be configured to efficiently generate an output voltage by using an external voltage supply to charge output node 450 to a first threshold voltage level (e.g., around VDD1) and using an internal voltage supply to finish charging the output node 450 to a second threshold voltage level (e.g., around VCCP). The external voltage supply may be denoted VDD1 and the internal voltage supply may be denoted VCCP.

Driver circuit 400 may include multiple components that are coupled via conductive lines. For example, driver circuit 400 may include multiple switching components (e.g., transistors and the like) and logic gates (e.g., NAND components and the like). The switching components are labeled S1 through S16 and the NAND components are labeled N1 and N2. A switching component may be an example of a transistor or other device that permits the flow of current (e.g., the transfer of charge) when activated and that prevents the flow of current when deactivated. Thus, a switching component may be said to establish a conductive path between components when activated and may be said to isolate two or more components when deactivated.

Although shown with specific types of components, it should be appreciated that the components depicted in FIG. 4 are exemplary and that other types of components can be used to implement driver circuit 400. It should also be appreciated that some components in driver circuit 400 are cascode components that may protect counterpart components from harmful voltages. For example, switching component S2 may be a cascode component that prevents the full VCCP voltage from be applied across counterpart switching component S3. Other cascode components include switching components S5, S9, S12, and S15, which may protect counterpart switching components S6, S10, S13, and S16, respectively. Each cascode component may be configured to activate/deactivate when its corresponding counterpart component activates/deactivates. Although shown with five cascode components, alternative implementations of driver circuit 400 may include fewer cascode components or eliminate cascode components completely.

In addition to including various components, driver circuit 400 may include or be coupled with one or more voltage supplies (which may also be referred to as voltage sources). The voltage supplies may include one or more internal voltage supplies and one or more external voltage supplies. For example, driver circuit 400 may include internal voltage supply VCCP, which may be configured to supply voltage of a first level (e.g., VCCP, which may be equal to 3.2 V), and external voltage supply VDD1, which may be configured to supply a voltage of a second level (e.g., VDD1, which may be equal to 1.8 V). An internal voltage supply may be a voltage supply that is generated by circuitry on the part that houses driver circuit 400, whereas an external voltage supply may be a voltage supply that is generated by circuitry external to the part that houses driver circuit 400. Compared to charging from an external voltage supply, charging from an internal voltage supply may be less efficient due to losses incurred from generating the internal voltage supply from the external voltage supplies. For example, charging from an internal voltage supply may involve the use of a capacitive pump that is less than 100% efficient (e.g., the capacitive pump may be 40% efficient meaning that the pump may draw 60% more energy than it supplies).

The operations of driver circuit 400 may be controlled by a control signal that is received by the driver circuit 400. The control signal may be generated and transmitted by a component (e.g., a memory controller) external to the driver circuit 400. In some cases, the level of the control signal may be shifted (e.g., by the level-shifter circuit 460) before it is received at driver circuit 400.

Buffer circuit 410 may be coupled with level-shifter circuit 460, feedback circuit 425, control circuit 440, and control circuit 445. Buffer circuit may include inverter 405-*a* and inverter 405-*b*. Buffer circuit 410 may be configured to receive the control signal (e.g., from level-shifter circuit 460 or another component) and provide a delayed version of that control signal to other components of driver circuit 400. In some cases, buffer circuit 410 may delay the control signal by inverting the control signal one or more times before providing it to other components in driver circuit 400.

Buffer circuit 410 may invert a control signal by activating and deactivating one or more switching components. For example, buffer circuit 410 may be configured to activate switching component S3 (and S2, when included) and deactivate switching component S1 when an input signal (e.g., the control signal) is high. So, a high input voltage may cause inverter 405-*a* to output a low voltage. Conversely, buffer circuit 410 may be configured to activate switching component S1 and deactivate switching component S3 (and S2, when included) when the input signal (e.g., the control signal) is low. Thus, a low input voltage may cause inverter 405-*a* to output a high voltage. Inverter 405-*b* may be configured to operate similarly to inverter 405-*a*.

Feedback circuit 425 may be coupled with first pull-up circuit 415 and second pull-up circuit 420. Feedback circuit 425 may include NAND component N1 and switching components S8, S9, and S10. Feedback circuit 425 may be configured to activate/deactivate the first pull-up circuit 415 and the second pull-up circuit 420 by modifying the output of feedback circuit 425. For instance, feedback circuit 425 may be configured to activate first pull-up circuit 415 when triggered to do so by buffer circuit 410. Feedback circuit 425 may also be configured to deactivate first pull-up circuit 415 and activate second pull-up circuit 420 when the voltage on output node 450 reaches a first threshold level (e.g., around VDD1). Additionally, feedback circuit 425 may be configured to deactivate second pull-up circuit 420.

First pull-up circuit 415 may be coupled with feedback circuit 425 and output node 450. First pull-up circuit may include switching component S7, which maybe coupled with voltage supply VDD1. First pull-up circuit 415 may be configured to transfer charge from voltage supply VDD1 to output node 450 when first pull-up circuit 415 is activated (e.g., first pull-up circuit may establish a conductive path between voltage supply VDD1 and output node 450). Thus, first pull-up circuit 415 may be configured to charge output node 450 to a first threshold voltage level (e.g., around VDD1) when activated. Additionally, first pull-up circuit 415 may be configured prevent or stop the transfer of charge from voltage supply VDD1 to output node 450 when first pull-up circuit 415 is deactivated (e.g., first pull-up circuit 415 may isolate voltage supply VDD1 from output node 450).

Second pull-up circuit 420 may be coupled with feedback circuit 425 (e.g., via control circuit 440) and output node 450. Second pull-up circuit 420 may include switching component S11, which may be coupled with voltage supply VCCP. Second pull-up circuit 420 may be configured to transfer charge from voltage supply VCCP to output node 450 when activated (e.g., by establishing a conductive path between voltage supply VCCP and output node 450). Thus, second pull-up circuit 420 may be configured to charge output node 450 to VCCP (e.g., a second threshold voltage level) when activated. Additionally, second pull-up circuit 420 may be configured prevent or stop the transfer of charge from voltage supply VCCP to output node 450 when deactivated (e.g., by isolating voltage supply VCCP from output node 450).

Control circuit 440 may be coupled with feedback circuit 425 and second pull-up circuit 420. Control circuit 440 may include NAND component N2, which may be coupled with NAND component N1. Control circuit 440 may be configured to modify the activation status second pull-up circuit 420 (e.g., control circuit 440 may be configured to activate and deactivate second pull-up circuit 420). For instance, control circuit 440 may be configured to modify its output based on input signals (e.g., from feedback circuit 425 and buffer circuit 410) so that second pull-up circuit 420 is activated or deactivated.

Control circuit 445 may be coupled with feedback circuit 425 and pull-down circuit 430. Control circuit 445 may include switching components S14, S15, and S16. Control circuit 445 may be configured to activate and deactivate pull-down circuit 430. For example, control circuit 445 may be configured to modify its output based on an input signal (e.g., from buffer circuit 410) so that pull-down circuit 430 is activated or deactivated.

Pull-down circuit 430 may be coupled with control circuit 445 and output node 450. Pull-down circuit 430 may include switching component S12 and switching component S13. Pull-down circuit 430 may be configured to provide a conductive path between output node 450 and a ground reference (denoted GND) so that the output node 450 discharges to around 0 V. Pull-down circuit 430 may also be configured to isolate the output node 450 from the ground reference so that the output node 450 can charge to the first and second threshold levels.

As noted, the specific types of components used to implement driver circuit 400 may be modified or omitted. For example, although shown as a P-channel transistor, in some implementations, switching component S7 may be an N-channel transistor. In such implementations, additional circuitry may be added to boost Voltage 1 to a level of at least VDD1 plus the threshold voltage of switching component S7. Similarly, although shown as a P-channel transistor, in some implementations switching component S11 may be an N-channel transistor. Accordingly, additional circuitry may be added to boost Voltage 4 to a level of at least VCCP plus the threshold voltage of switching component S11.

Driver circuit 400 may also be modified by omitting level-shifter circuit 460. For example, level-shifter circuit 460 may be excluded from driver circuit 400 when the external voltage supply is VCCP rather than VDD1. Additionally or alternatively, driver circuit 400 may be modified by using a different buffer circuit 410 or removing buffer circuit 410 completely.

Another modification of driver circuit 400 may involve the removal of switching components S2, S5, S9, S12 and S15. As noted, these components are cascode components that protect their counterpart components (e.g., S3, S6, S10, S13 and S16) from harmful voltages. However, these cascode components may be omitted from driver circuit 400 if their counterpart components are designed to tolerate voltages up to VCCP.

The operation of driver circuit 400 may generate various voltages at different points within the driver circuit 400. For ease of reference, certain nodes where a voltage develops may be indicated by a dashed circle with a number in it. Nodes that are labeled with the same number may be electrically connected (e.g., via conductive lines) so that the same voltage develops on each similarly labeled node. For example, the same voltage may develop on all of the nodes labeled with the number 1. The voltages associated with these nodes may be represented by the voltage waveforms 500 described with reference to FIG. 5.

Figure 5:
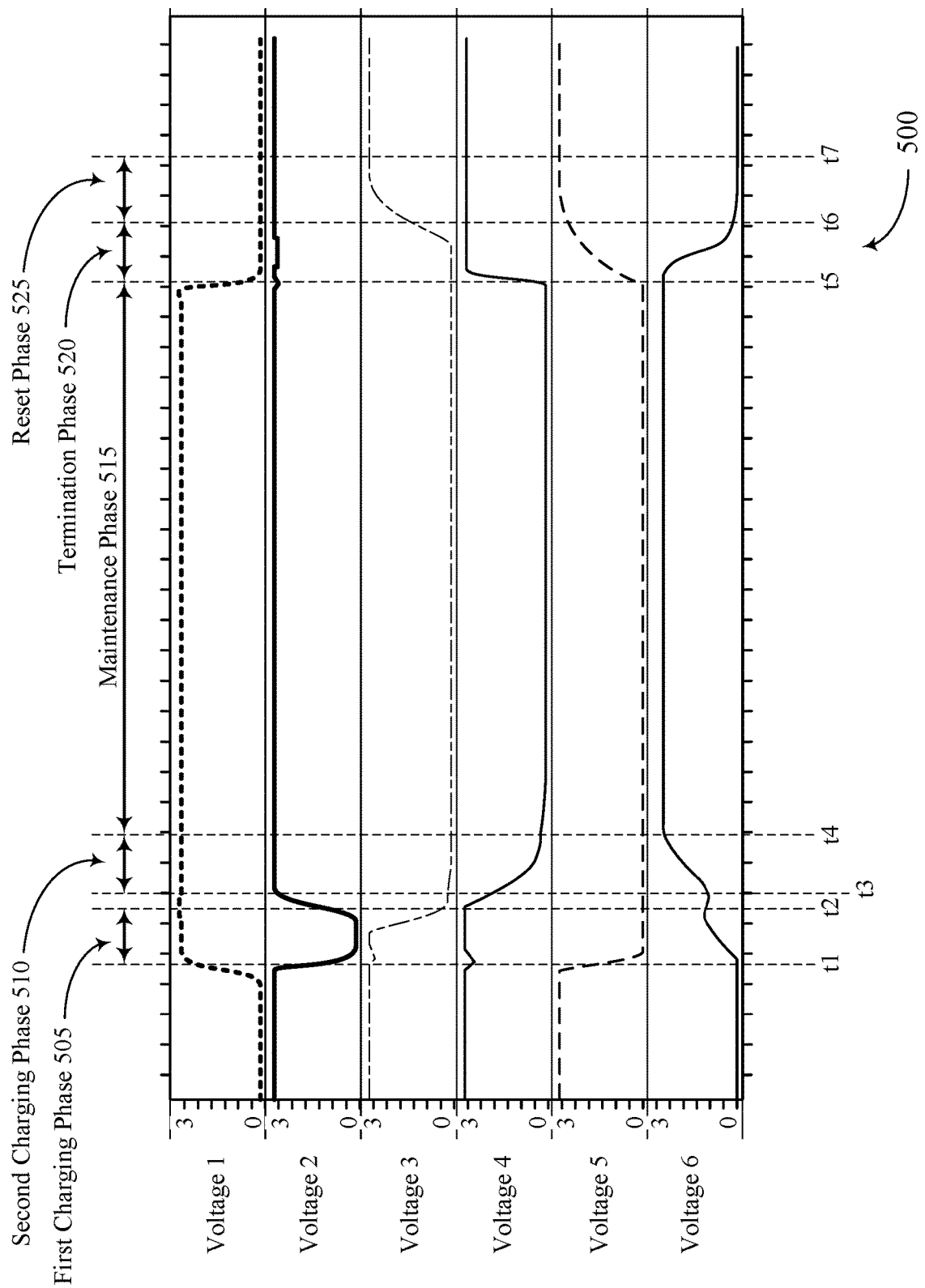
FIG. 5 illustrates an example of a voltage waveforms that support power-efficient generation of voltage in accordance with examples as disclosed herein.

FIG. 5 illustrates an example of voltage waveforms 500 that support power-efficient generation of voltage in accordance with examples as disclosed herein. Voltage waveforms 500 may be examples of voltages at various nodes of driver circuit 400. Each voltage waveform may represent a voltage that develops at the node over time. For example, Voltage 1 may represent the voltage that develops at the nodes labeled 1, Voltage 2 may represent the voltage that develops at the nodes labeled 2, Voltage 3 may represent the voltage that develops at the node labeled 3, Voltage 4 may represent the voltage that develops at the node labeled 4, Voltage 5 may represent the voltage that develops on the node labeled 5, and Voltage 6 may represent the voltage that develops on the node labeled 6 (which may also be referred to as output node 450). The voltages at these nodes may be developed during a first charging phase 505, a second charging phase 510, a maintenance phase 515, a termination phase 520, and a reset phase 525.

At time t1 (e.g., the beginning of the first charging phase 505), the first pull-up circuit 415 may be activated. For example, Voltage 1 may transition from low to high and in doing so trigger logic gate N1 to switch from outputting a high voltage to outputting a low voltage. Accordingly, at or around t1, Voltage 2 may be reduced. Reducing Voltage 2 may activate switching component S7, which may transfer charge between voltage supply VDD1 and output node 450. Thus, first pull-up circuit 415 may be activated so that output node 450 charges from voltage supply VDD1, resulting in Voltage 6 increasing.

The transition of Voltage 1 from low to high may also trigger deactivation of switching component S13, which may isolate output node 450 from the ground reference. Thus, pull-down circuit 430 may be deactivated to prevent the output node 450 from discharging. The transition of Voltage 1 may trigger deactivation of pull-down circuit 430 by activating switching component S16 so that the voltage seen at node 5 is low (e.g., around 0 V). The transition of Voltage 1 may also deactivate switching component S14 so that node 5 is isolated from voltage supply VCCP. Accordingly, Voltage 5 may decrease because node 5 is coupled with the ground reference and switching component S13 may turn off, isolating node 6 from the ground reference.

When Voltage 6 reaches the first threshold level (e.g., around VDD1) at time t2, feedback circuit 425 may respond by modifying its output so that first pull-up circuit 415 is deactivated. For example, when Voltage 6 reaches the first threshold level switching component S8 may deactivate and switching component S10 may activate. Accordingly, Voltage 3 may decrease because node 3 is coupled with the ground reference (and isolated from voltage supply VCCP). The decrease in Voltage 3 may trigger NAND component N1 to modify its output so that Voltage 2 increases, turning switching component S7 off. Thus, node 6 may be isolated from VDD1 before second pull-up circuit 420 is activated. Isolating node 6 from voltage supply VDD1 before activating second pull-up circuit 420 may avoid charging from both VDD1 and VCCP at the same time, which would short the voltage supplies, pull down VCCP, and waste current. To ensure that VCCP and VDD1 are not shorted together, the slew rate of switching component S7 may be faster than the slew rate of switching component S11.

At time t3 (e.g., the beginning of the second charging phase 510), second pull-up circuit 420 may be activated. For example, Voltage 2 may increase to a level that causes NAND component N2 to modify its output so that Voltage 4 decreases. The decrease in Voltage 4 may turn on switching component S11 so that node 6 is coupled with voltage supply VCCP. Accordingly, node 6 may start charging from voltage supply VCCP, causing Voltage 6 to increase. Node 6 may continue to charge from voltage supply VCCP until VCCP (e.g., the second threshold voltage) is reached at time t4. During the second charging phase 510, pull-down circuit 430 may remain deactivated to avoid sinking current, which wastes power.

Between time t4 and time t5 (e.g., during the maintenance phase 515), the voltage on node 6 may be maintained at VCCP (e.g., the second threshold voltage) so that it can be provided to other components for use. Thus, second pull-up circuit 420 may remain activated during maintenance phase 515.

At time t5, second pull-up circuit 420 may be deactivated to conserve power when driver circuit 400 is not in use. For example, Voltage 1 may decrease, causing NAND component N2 to modify its output so that Voltage 4 increases and turns off switching component S11. Accordingly, node 6 may be isolated from voltage supply VCCP. Reducing Voltage 1 may also cause pull-down circuit 430 to be activated. For example, reducing Voltage 1 may activate switching component S13 and deactivate switching component S16, resulting in node 5 being coupled with voltage supply VCCP and isolated from the ground reference. Accordingly, Voltage 5 may increase and switching component S13 may turn on, thereby coupling node 6 with the ground reference. Once node 6 is coupled with the ground reference, Voltage 6 may decrease to a voltage level at or around 0V.

It should be appreciated that activating switching component S13 while switching component S11 is activated may short voltage supply VCCP to ground (e.g., causing a discharge of current). Accordingly, switching component S11 may be configured to have a faster slew rate than switching component S13 so that switching component S11 turns off before switching component S13 turns on. Put another way, Voltage 4 may transition faster than Voltage 5. Thus, simultaneous activation of switching components S11 and S13 may be avoided.

At time t6 (e.g., the beginning of reset phase 525), the reduction of Voltage 6 may cause feedback circuit 425 to modify its output so that first pull-up circuit S7 is ready to be activated the next time Voltage 1 increases. For example, reducing Voltage 6 may deactivate switching component S10 and activate switching component S8, resulting in node 3 being coupled to voltage supply VCCP and isolated from the ground reference. Accordingly, Voltage 3 may increase. Thus, after time t7, driver circuit 400 may be ready for a subsequent charging operation (e.g., driver circuit 400 may be in the same state it was prior to first charging phase 505).

As noted, NAND component N2 may be configured to activate second pull-up circuit 420 when Voltage 1 and Voltage 2 are high. Such a configuration may result in an undesired reduction of Voltage V4 (or even premature activation of second pull-up circuit 420) if Voltage 1 transitions high while Voltage 2 is also high prior to first charging phase 505. The addition of buffer circuit 410 may prevent such an effect, which wastes power. For example, the buffer circuit 410 may delay an incoming control signal, the result of which is Voltage 1, so that the premature reduction of Voltage 4 by NAND component N2 is mitigated or avoided entirely (e.g., so that the rising edge of Voltage 1 closely coincides with the falling edge of Voltage 2).

Buffer circuit 410 may delay the control signal by inverting it one or more times. For instance, buffer circuit 410 may receive a control signal in the form of a direct current (DC) voltage. Inverter 405-*a* may output a voltage that is the inverse of the control signal and that voltage may be input into inverter 405-*b*. Inverter 405-*b* may output a voltage that is the inverse of its input voltage, resulting a voltage (e.g., Voltage 1) that is the same level as the control signal but delayed. Thus, the application of Voltage 1 may be appropriately timed by the addition of a properly tuned buffer circuit 410. However, alternative designs (e.g., appropriately skewed gates) may be implemented to mitigate the same issue without the addition of buffer circuit 410. Thus, buffer circuit 410 may be an optional feature of driver circuit 400.

Figure 6:
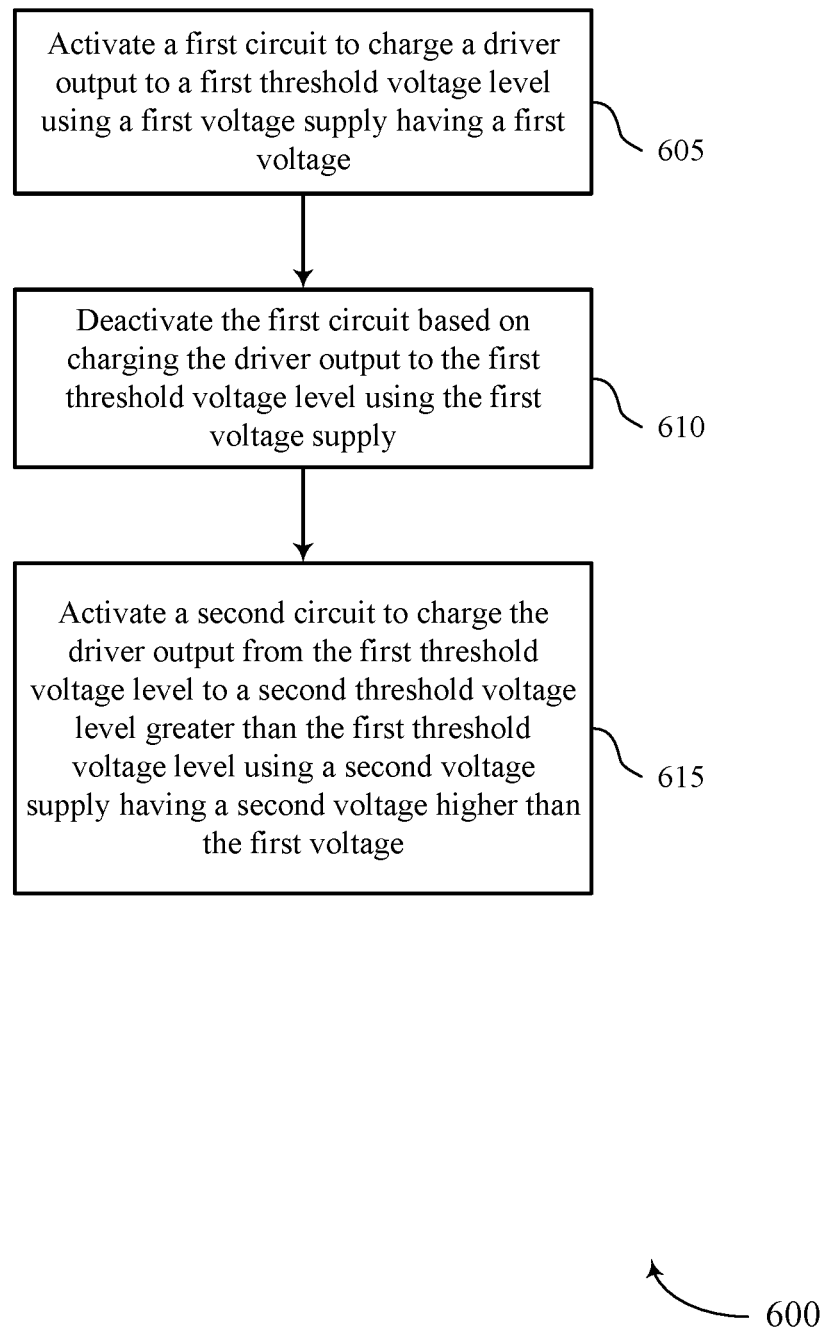
FIGS. 6 through 9 show flowcharts illustrating a method or methods that support power-efficient generation of voltage in accordance with examples as disclosed herein.

FIG. 6 shows a flowchart illustrating a method or methods 600 that supports power-efficient generation of voltage in accordance with aspects of the present disclosure. The operations of method 600 may be implemented by a memory device or its components as described herein. In some examples, a memory device may execute a set of instructions to control the functional elements of the memory device to perform the described functions. Additionally or alternatively, a memory device may perform aspects of the described functions using special-purpose hardware.

At 605, the memory device may activate a first circuit (e.g., first pull-up circuit 415) to charge a driver output (e.g., output node 450) to a first threshold voltage level using a first voltage supply (e.g., VDD1) having a first voltage. The operations of 605 may be performed according to the methods described herein. In some examples, aspects of the operations of 605 may be performed by a feedback circuit as described with reference to FIGS. 3A-3C and 4.

At 610, the memory device may deactivate the first circuit based on charging the driver output to the first threshold voltage level using the first voltage supply. The operations of 610 may be performed according to the methods described herein. In some examples, aspects of the operations of 610 may be performed by a feedback circuit as described with reference to FIGS. 3A-3C and 4.

At 615, the memory device may activate a second circuit (e.g., second pull-up circuit 420) to charge the driver output from the first threshold voltage level to a second threshold voltage level greater than the first threshold voltage level using a second voltage supply (e.g., VCCP) having a second voltage higher than the first voltage. The operations of 615 may be performed according to the methods described herein. In some examples, aspects of the operations of 615 may be performed by a feedback circuit (e.g., via a control circuit) as described with reference to FIGS. 3A-3C and 4.

In some examples, an apparatus as described herein may perform a method or methods, such as the method 600. The apparatus may include features, means, or instructions (e.g., a non-transitory computer-readable medium storing instructions executable by a processor) for activating a first circuit (e.g., first pull-up circuit 415) to charge a driver output (e.g., output node 450) to a first threshold voltage level using a first voltage supply (e.g., VDD1) having a first voltage; deactivating the first circuit based on charging the driver output to the first threshold voltage level using the first voltage supply; and activating a second circuit (e.g., second pull-up circuit 420) to charge the driver output from the first threshold voltage level to a second threshold voltage level greater than the first threshold voltage level using a second voltage supply (e.g., VCCP) having a second voltage higher than the first voltage.

In some examples of the method 600 and the apparatus described herein, activating the first circuit may include operations, features, means, or instructions for activating a switching component (e.g., switching component S7) to establish a conductive path between the driver output and the first voltage supply. In some examples of the method 600 and the apparatus described herein, deactivating the first circuit may include operations, features, means, or instructions for deactivating the switching component (e.g., switching component S7) to isolate the driver output from the first voltage supply.

In some examples of the method 600 and the apparatus described herein, activating the second circuit may include operations, features, means, or instructions for activating a second switching component (e.g., switching component S11) to establish a conductive path between the driver output and the second voltage supply after deactivating the first circuit.

Some examples of the method 600 and the apparatus described herein may further include operations, features, means, or instructions for modifying, based on a voltage of the driver output (e.g., Voltage 6), an output of a logic component (e.g., NAND component N1) coupled with the first circuit and the second circuit, where the modification deactivates the first circuit and activates the second circuit.

Some examples of the method 600 and the apparatus described herein may further include operations, features, means, or instructions for receiving a control signal, and deactivating the second circuit, after charging the driver output to the second threshold voltage level, based on the control signal.

Some examples of the method 600 and the apparatus described herein may further include operations, features, means, or instructions for activating a third circuit to charge the driver output from the second threshold voltage level to a third threshold voltage level greater than the second threshold voltage level using a third voltage supply having a third voltage higher than the second voltage.

Some examples of the method 600 and the apparatus described herein may further include operations, features, means, or instructions for receiving an externally generated control signal at a driver (e.g., driver circuit 400) that includes the first and second circuits, and inverting the externally generated control signal before applying the externally generated control signal to a first logic component (e.g., NAND component N1) coupled with the first circuit and a second logic component (e.g., NAND component N2) coupled with the second circuit.

Figure 7:
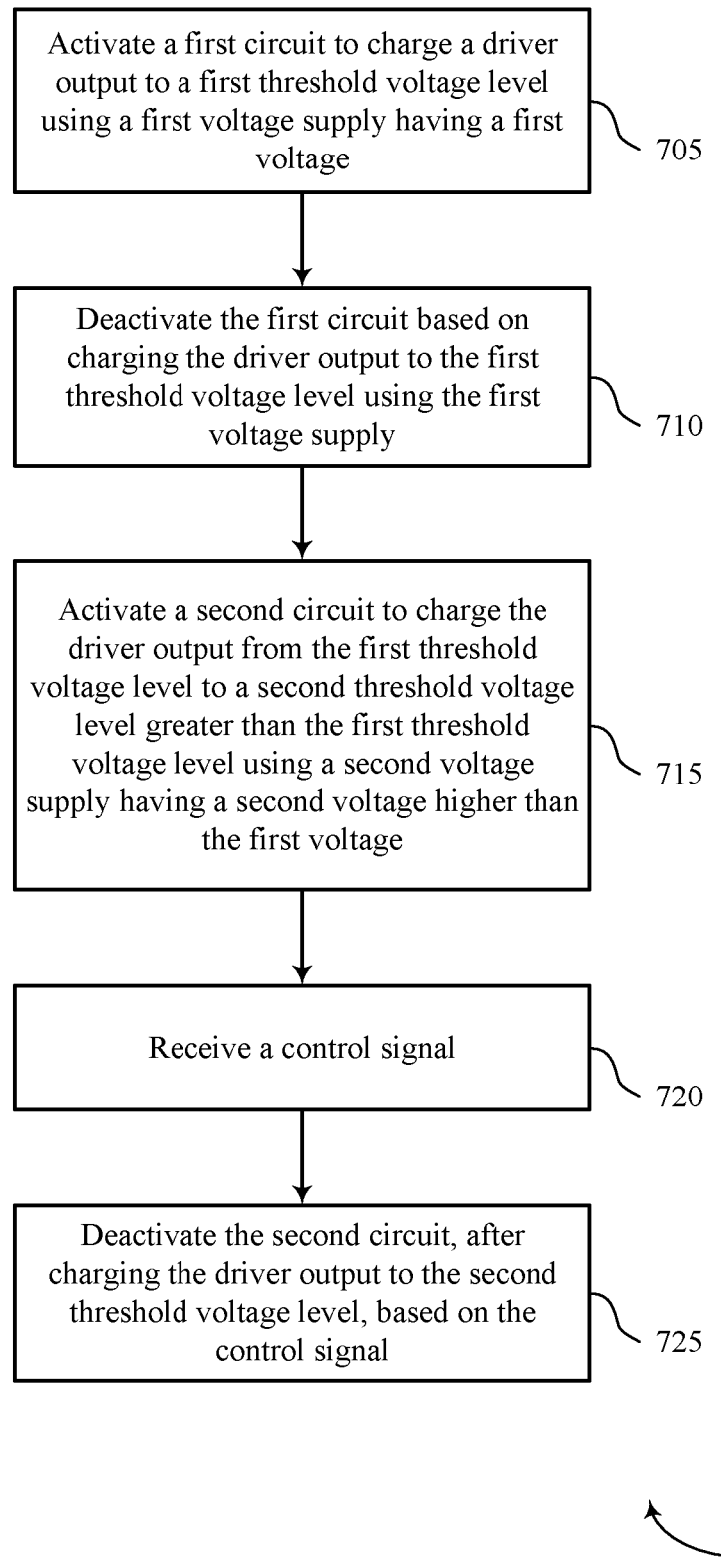

FIG. 7 shows a flowchart illustrating a method or methods 700 that supports power-efficient generation of voltage in accordance with aspects of the present disclosure. The operations of method 700 may be implemented by a memory device or its components as described herein. In some examples, a memory device may execute a set of instructions to control the functional elements of the memory device to perform the described functions. Additionally or alternatively, a memory device may perform aspects of the described functions using special-purpose hardware.

At 705, the memory device may activate a first circuit (e.g., first pull-up circuit 415) to charge a driver output (e.g., output node 450) to a first threshold voltage level using a first voltage supply (e.g., VDD1) having a first voltage. The operations of 705 may be performed according to the methods described herein. In some examples, aspects of the operations of 705 may be performed by a feedback circuit as described with reference to FIGS. 3A-3C and 4.

At 710, the memory device may deactivate the first circuit based on charging the driver output to the first threshold voltage level using the first voltage supply. The operations of 710 may be performed according to the methods described herein. In some examples, aspects of the operations of 710 may be performed by a feedback circuit as described with reference to FIGS. 3A-3C and 4.

At 715, the memory device may activate a second circuit (e.g., second pull-up circuit 420) to charge the driver output from the first threshold voltage level to a second threshold voltage level greater than the first threshold voltage level using a second voltage supply (e.g., VCCP) having a second voltage higher than the first voltage. The operations of 715 may be performed according to the methods described herein. In some examples, aspects of the operations of 715 may be performed by a feedback circuit (e.g., through a control circuit) as described with reference to FIGS. 3A-3C and 4.

At 720, the memory device may receive a control signal. The operations of 720 may be performed according to the methods described herein. In some examples, aspects of the operations of 720 may be performed by a buffer circuit or feedback circuit as described with reference to FIGS. 3A-3C and 4.

At 725, the memory device may deactivate the second circuit, after charging the driver output to the second threshold voltage level, based on the control signal. The operations of 725 may be performed according to the methods described herein. In some examples, aspects of the operations of 725 may be performed by a control circuit as described with reference to FIGS. 3A-3C and 4.

Figure 8:
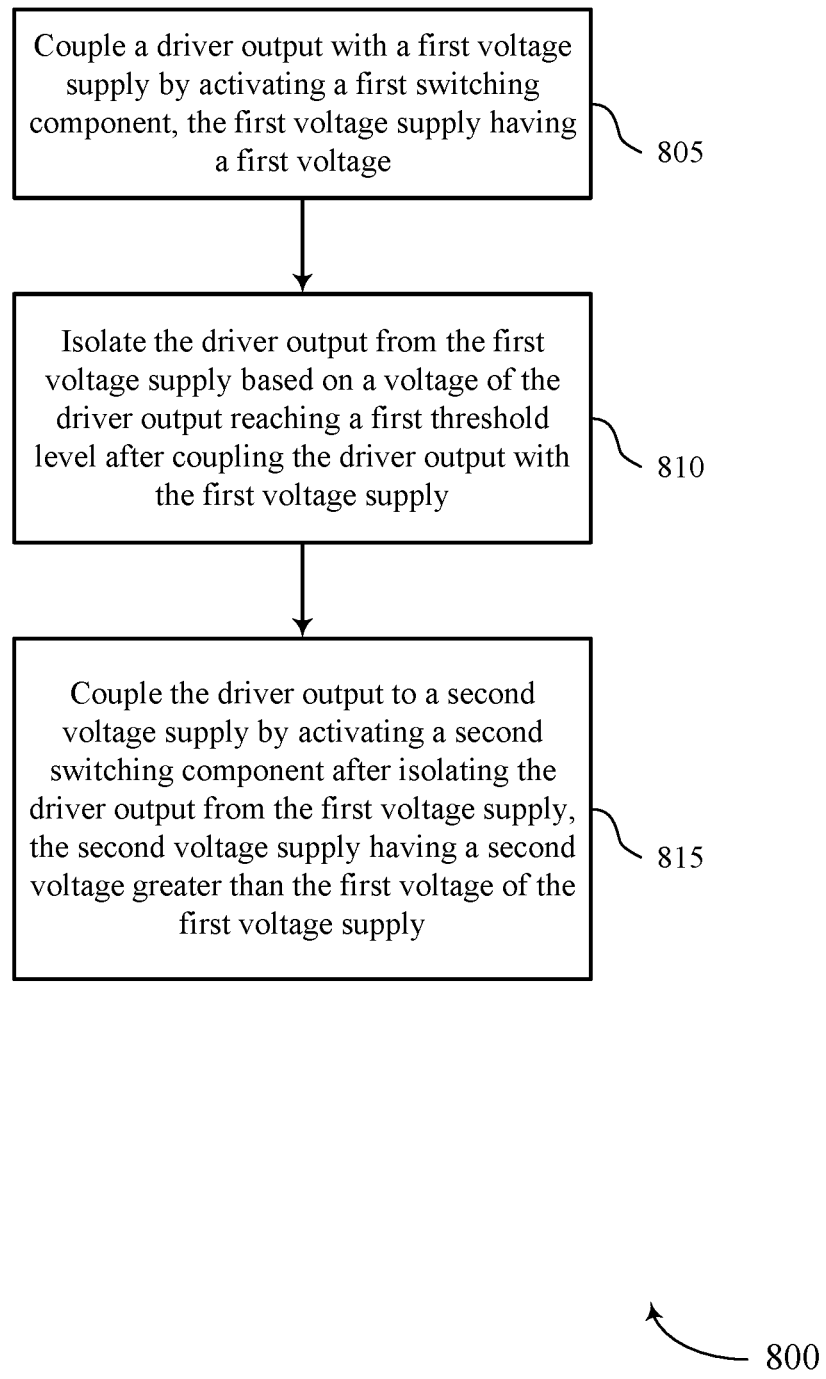

FIG. 8 shows a flowchart illustrating a method or methods 800 that supports power-efficient generation of voltage in accordance with aspects of the present disclosure. The operations of method 800 may be implemented by a memory device or its components as described herein. In some examples, a memory device may execute a set of instructions to control the functional elements of the memory device to perform the described functions. Additionally or alternatively, a memory device may perform aspects of the described functions using special-purpose hardware.

At 805, the memory device may couple a driver output (e.g., output node 450) with a first voltage supply (e.g., VDD1) by activating a first switching component (e.g., switching component S7), the first voltage supply having a first voltage. The operations of 805 may be performed according to the methods described herein. In some examples, aspects of the operations of 805 may be performed or facilitated by a feedback circuit as described with reference to FIGS. 3A-3C and 4.

At 810, the memory device may isolate the driver output from the first voltage supply based on a voltage of the driver output reaching a first threshold level after coupling the driver output with the first voltage supply. The operations of 810 may be performed according to the methods described herein. In some examples, aspects of the operations of 810 may be performed or facilitated by a feedback circuit as described with reference to FIGS. 3A-3C and 4.

At 815, the memory device may couple the driver output to a second voltage supply (e.g., VCCP) by activating a second switching component (e.g., switching component S11) after isolating the driver output from the first voltage supply, the second voltage supply having a second voltage greater than the first voltage of the first voltage supply. The operations of 815 may be performed according to the methods described herein. In some examples, aspects of the operations of 815 may be performed or facilitated by a feedback circuit (e.g., through a control circuit) as described with reference to FIGS. 3A-3C and 4.

In some examples, an apparatus as described herein may perform a method or methods, such as the method 800. The apparatus may include features, means, or instructions (e.g., a non-transitory computer-readable medium storing instructions executable by a processor) for coupling a driver output (e.g., output node 450) with a first voltage supply (e.g., VDD1) by activating a first switching component (e.g., switching component S7), the first voltage supply having a first voltage; isolating the driver output from the first voltage supply based on a voltage of the driver output reaching a first threshold level after coupling the driver output with the first voltage supply; and coupling the driver output to a second voltage supply (e.g., VCCP) by activating a second switching component (e.g., switching component S11) after isolating the driver output from the first voltage supply, the second voltage supply having a second voltage greater than the first voltage of the first voltage supply.

Some examples of the method 800 and the apparatus described herein may further include operations, features, means, or instructions for applying a voltage (e.g., Voltage 2) to the first switching component, where applying the voltage activates the first switching component so that the driver output receives charge from the first voltage supply.

In some examples of the method 800 and the apparatus described herein, isolating the driver output from the first voltage supply may include operations, features, means, or instructions for modifying the voltage (e.g., Voltage 2) applied to the first switching component, where modifying the voltage deactivates the first switching component so that the driver output stops receiving charge from the first voltage supply.

Some examples of the method 800 and the apparatus described herein may further include operations, features, means, or instructions for applying a voltage (e.g., Voltage 4) to the second switching component, where applying the voltage activates the second switching component so that the driver output receives charge from the second voltage supply.

Some examples of the method 800 and the apparatus described herein may further include operations, features, means, or instructions for modifying, based on the voltage of the driver output, a voltage (e.g., Voltage 3) output by a logic component (e.g., NAND component N1) coupled with the first switching component, where modifying the voltage output by the logic component deactivates the first switching component.

Some examples of the method 800 and the apparatus described herein may further include operations, features, means, or instructions for modifying, based on the voltage output by the logic component, a voltage (e.g., Voltage 4) output by a second logic component (e.g., NAND component N2) coupled with the second switching component, where modifying the voltage output by the second logic component activates the second switching component.

Some examples of the method 800 and the apparatus described herein may further include operations, features, means, or instructions for isolating the driver output from the second voltage supply after coupling the driver output to a second voltage supply. Some examples of the method 800 and the apparatus described herein may further include operations, features, means, or instructions for coupling the driver output to a ground reference after isolating the driver output from the second voltage supply.

Figure 9:
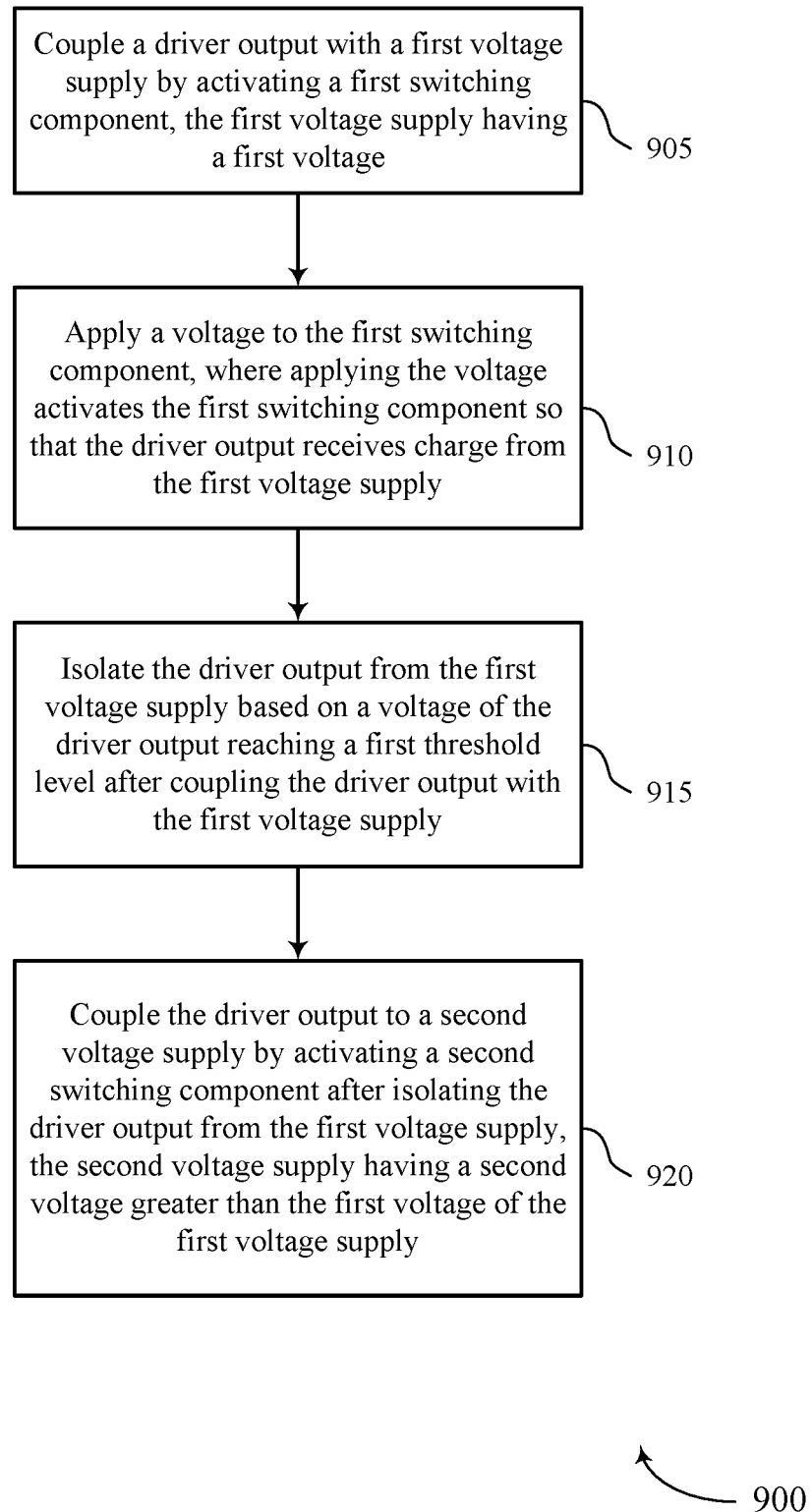

FIG. 9 shows a flowchart illustrating a method or methods 900 that supports power-efficient generation of voltage in accordance with aspects of the present disclosure. The operations of method 900 may be implemented by a memory device or its components as described herein. In some examples, a memory device may execute a set of instructions to control the functional elements of the memory device to perform the described functions. Additionally or alternatively, a memory device may perform aspects of the described functions using special-purpose hardware.

At 905, the memory device may couple a driver output (e.g., output node 450) with a first voltage supply (e.g., VDD1) by activating a first switching component (e.g., switching component S7), the first voltage supply having a first voltage. The operations of 905 may be performed according to the methods described herein. In some examples, aspects of the operations of 905 may be performed or facilitated by a feedback circuit as described with reference to FIGS. 3A-3C and 4.

At 910, the memory device may apply a voltage (e.g., Voltage 2) to the first switching component, where applying the voltage activates the first switching component so that the driver output receives charge from the first voltage supply. The operations of 910 may be performed according to the methods described herein. In some examples, aspects of the operations of 910 may be performed or facilitated by a feedback circuit as described with reference to FIGS. 3A-3C and 4.

At 915, the memory device may isolate the driver output from the first voltage supply based on a voltage (e.g., Voltage 6) of the driver output reaching a first threshold level after coupling the driver output with the first voltage supply. The operations of 915 may be performed according to the methods described herein. In some examples, aspects of the operations of 915 may be performed or facilitated by a feedback circuit as described with reference to FIGS. 3 and 4.

At 920, the memory device may couple the driver output to a second voltage supply (e.g., VCCP) by activating a second switching component (e.g., switching component S11) after isolating the driver output from the first voltage supply, the second voltage supply having a second voltage greater than the first voltage of the first voltage supply. The operations of 920 may be performed according to the methods described herein. In some examples, aspects of the operations of 920 may be performed or facilitated by a feedback circuit (e.g., through a control circuit) as described with reference to FIGS. 3A-3C and 4.

In some examples, the apparatus that performs aspects of methods 600, 700 800, and 900 may be an apparatus that includes a first switching component (e.g., switching component S7) coupled with both an output node (e.g., output node 450) of the driver circuit 400 and a first voltage supply (e.g., VDD1) operable to supply a first voltage. The apparatus may also include a feedback circuit (e.g., feedback circuit 425) that is coupled with the output node of the driver and an input (e.g., the gate) of the first switching component. The apparatus may also include a second switching component (e.g., switching component S11) that is coupled with both the output node of the driver and a second voltage supply (e.g., VCCP) that is operable to supply a higher voltage than the first voltage. In some examples, the first voltage supply is external to a component that includes the driver and the second voltage supply.

In some examples, the feedback circuit may include a third switching component (e.g., switching component S8 or S9) coupled with the second voltage supply, a fourth switching component (e.g., switching component S10) coupled with a ground reference, and a logic component (e.g., NAND component N1) coupled with the third switching component and the fourth switching component.

In some examples, the apparatus may include a first logic component (e.g., NAND component N1) that is part of the feedback circuit. In such cases, an output of the first logic component may be coupled with the first switching component. In some examples, the apparatus may include a second logic component (e.g., NAND component N2) coupled with the output of the first logic component and the second switching component.

In some examples, the apparatus may include a third switching component (e.g., switching component S14) coupled with the second voltage supply, a fourth switching component (e.g., switching component S16) coupled with a ground reference, and a fifth switching component (e.g., switching component S13) coupled with the output node and the third switching component and the fourth switching component.

In some examples, the apparatus may include a first logic component (e.g., NAND component N1) coupled with the first switching component, a second logic component (e.g., NAND component N2) coupled with the second switching component, and a set of switching components (e.g., switching components S1 through S6) operable to invert a control signal before applying (e.g., transferring or providing) it to the first and second logic components.

In some examples, the apparatus that performs aspects of methods 600, 700 800, and 900 may be an apparatus that includes In some examples, the apparatus may include a first pull-up circuit (e.g., first pull-up circuit 415) operable to couple an output node (e.g., output node 450) of a driver with a first voltage supply (e.g., voltage supply VDD1) that is operable to supply a voltage of a first level. The apparatus may include a feedback circuit (e.g., feedback circuit 425) coupled with the first pull-up circuit and operable to deactivate the first pull-up circuit when a voltage of the output node reaches the first level. The apparatus may also include a second pull-up circuit (e.g., second pull-up circuit 420) operable to couple the output node to a second voltage supply (e.g., VCCP) after the first pull-up circuit is deactivated. The second voltage supply may be operable to supply a voltage of a second level higher than the first level.

In some examples, the feedback circuit may be operable to activate and deactivate the first pull-up circuit and the second pull-up circuit based at least in part on the voltage of the output node. In some examples, the apparatus also includes a buffer circuit (e.g., buffer circuit 410) operable to delay a control signal applied to a first logic component (e.g., NAND component N1) coupled with the first pull-up circuit and a second logic component (e.g., NAND component N2) coupled with the second pull-up circuit. In some examples, the apparatus may include a pull-down circuit (e.g., pull-down circuit 430) that is operable to couple the output node to a ground reference so that the output node discharges to threshold level.

It should be noted that the methods described herein are possible implementations, and that the operations and the steps may be rearranged or otherwise modified and that other implementations are possible. Furthermore, portions from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

As used herein, the term "virtual ground" refers to a node of an electrical circuit that is held at a voltage of approximately zero volts (0V) but that is not directly coupled with ground. Accordingly, the voltage of a virtual ground may temporarily fluctuate and return to approximately 0V at steady state. A virtual ground may be implemented using various electronic circuit elements, such as a voltage divider consisting of operational amplifiers and resistors. Other implementations are also possible. "Virtual grounding" or "virtually grounded" means connected to approximately 0V.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some cases, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals can be communicated between components over the conductive path. When a component, such as a controller, couples other components together (e.g., coupled component A with component B, or coupled component A to component B), the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components from one another, the controller affects a change that prevents signals from flowing between the components using a conductive path that previously permitted signals to flow.

As used herein, the term "substantially" means that the modified characteristic (e.g., a verb or adjective modified by the term substantially) need not be absolute but is close enough to achieve the advantages of the characteristic.

As used herein, the term "shorting" refers to a relationship between components in which a conductive path is established between the components via the activation of a single intermediary component between the two components in question. For example, a first component shorted to a second component may exchange signals with the second component when a switch between the two components is closed. Thus, shorting may be a dynamic operation that enables the flow of charge between components (or lines) that are in electronic communication.

The devices discussed herein, including a memory array, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOS), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, the described functions can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. A method, comprising:
    activating a first circuit to charge a driver output to a first threshold voltage level using a first voltage supply having a first voltage;
    modifying, based at least in part on charging the driver output to the first threshold voltage level using the first voltage supply, an output voltage of a logic component coupled with the first circuit and a second circuit, wherein the modification:
    deactivates the first circuit; and
    activates the second circuit to charge the driver output from the first threshold voltage level to a second threshold voltage level greater than the first threshold voltage level using a second voltage supply having a second voltage higher than the first voltage.

2. The method of claim 1, wherein activating the first circuit comprises:
    activating a switching component to establish a conductive path between the driver output and the first voltage supply.

3. The method of claim 2, wherein activating the second circuit comprises:
    activating a second switching component to establish a conductive path between the driver output and the second voltage supply after deactivating the first circuit.

4. The method of claim 2, wherein deactivating the first circuit comprises:
    deactivating the switching component to isolate the driver output from the first voltage supply.

5. The method of claim 1, further comprising:
    receiving a control signal; and
    deactivating the second circuit, after charging the driver output to the second threshold voltage level, based at least in part on the control signal.

6. The method of claim 5, further comprising:
    activating a third circuit to charge the driver output from the second threshold voltage level to a third threshold voltage level greater than the second threshold voltage level using a third voltage supply having a third voltage higher than the second voltage.

7. A method comprising:
    receiving an externally generated control signal at a driver comprising a first circuit and a second circuit;
    inverting the externally generated control signal before applying the externally generated control signal to a first logic component coupled with the first circuit and a second logic component coupled with the second circuit;
    activating the first circuit to charge a driver output to a first threshold voltage level using a first voltage supply having a first voltage;
    deactivating the first circuit based at least in part on charging the driver output to the first threshold voltage level using the first voltage supply; and
    activating the second circuit to charge the driver output from the first threshold voltage level to a second threshold voltage level greater than the first threshold voltage level using a second voltage supply having a second voltage higher than the first voltage.

8. A method, comprising:
    coupling a driver output with a first voltage supply by activating a first switching component, the first voltage supply having a first voltage;
    modifying, based at least in part on a voltage of the driver output reaching a first threshold level after coupling the driver output with the first voltage supply, a voltage output by a logic component coupled with the first switching component;
    deactivating the first switching component based at least in part on the modification of the voltage output by the logic component, wherein deactivating the first switching component isolates the driver output from the first voltage supply; and coupling the driver output to a second voltage supply by activating a second switching component after isolating the driver output from the first voltage supply, the second voltage supply having a second voltage greater than the first voltage of the first voltage supply.

9. The method of claim 8, further comprising:

applying a voltage to the first switching component, wherein applying the voltage activates the first switching component so that the driver output receives charge from the first voltage supply.

10. The method of claim 9, wherein the driver output stops receiving charge from the first voltage supply based at least in part on deactivating the first switching component.

11. The method of claim 9, further comprising:

applying a voltage to the second switching component, wherein applying the voltage activates the second switching component so that the driver output receives charge from the second voltage supply.

12. The method of claim 8, further comprising:

modifying, based at least in part on the voltage output by the logic component, a voltage output by a second logic component coupled with the second switching component, wherein modifying the voltage output by the second logic component activates the second switching component.

13. A method comprising:

coupling a driver output with a first voltage supply by activating a first switching component, the first voltage supply having a first voltage;

isolating the driver output from the first voltage supply based at least in part on a voltage of the driver output reaching a first threshold level after coupling the driver output with the first voltage supply;

coupling the driver output to a second voltage supply by activating a second switching component after isolating the driver output from the first voltage supply, the second voltage supply having a second voltage greater than the first voltage of the first voltage supply;

isolating the driver output from the second voltage supply after coupling the driver output to the second voltage supply; and coupling the driver output to a ground reference after isolating the driver output from the second voltage supply.

14. An apparatus, comprising:

a first switching component coupled with an output node of a driver and a first voltage supply operable to supply a first voltage;

a feedback circuit coupled with the output node of the driver and an input the first switching component;

a first logic component that is part of the feedback circuit, wherein an output of the first logic component is coupled with the first switching component;

a second switching component coupled with the output node of the driver and a second voltage supply operable to supply a higher voltage than the first voltage; and a second logic component coupled with the output of the first logic component and the second switching component.

15. The apparatus of claim 14, wherein the first voltage supply is external to a component that includes the driver and the second voltage supply.

16. The apparatus of claim 14, wherein the feedback circuit comprises:

a third switching component coupled with the second voltage supply;

a fourth switching component coupled with a ground reference wherein the first logic component is coupled with the third switching component and the fourth switching component.

17. The apparatus of claim 14, further comprising:

a third switching component coupled with the second voltage supply;

a fourth switching component coupled with a ground reference; and a fifth switching component coupled with the output node and the third switching component and the fourth switching component.

18. The apparatus of claim 14, further comprising:

a set of switching components operable to invert a control signal before applying it to the first and second logic components.

19. An apparatus, comprising:

a first pull-up circuit operable to couple an output node of a driver with a first voltage supply that is operable to supply a voltage of a first level;

a feedback circuit coupled with the first pull-up circuit and operable to deactivate the first pull-up circuit when a voltage of the output node reaches the first level; and a second pull-up circuit operable to couple the output node to a second voltage supply after the first pull-up circuit is deactivated, wherein the second voltage supply is operable to supply a voltage of a second level higher than the first level.

20. The apparatus of claim 19, wherein the feedback circuit is operable to activate and deactivate the first pull-up circuit and the second pull-up circuit based at least in part on a voltage of the output node.

21. The apparatus of claim 19, further comprising:

a buffer circuit operable to delay a control signal applied to a first logic component coupled with the first pull-up circuit and a second logic component coupled with the second pull-up circuit.

22. The apparatus of claim 19, further comprising:

a pull-down circuit operable to couple the output node to a ground reference such that the output node discharges to threshold level.

* * * * *